United States Patent
Yamamoto et al.

(10) Patent No.: US 11,264,867 B2
(45) Date of Patent: Mar. 1, 2022

(54) MOTOR DRIVE DEVICE

(71) Applicant: FANUC CORPORATION, Yamanashi (JP)

(72) Inventors: Kazuhiro Yamamoto, Yamanashi (JP); Makoto Takeshita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 368 days.

(21) Appl. No.: 16/376,770

(22) Filed: Apr. 5, 2019

(65) Prior Publication Data
US 2019/0312486 A1    Oct. 10, 2019

(30) Foreign Application Priority Data
Apr. 9, 2018   (JP) .............................. JP2018-074956

(51) Int. Cl.
*H02K 7/14*    (2006.01)
*H05K 7/20*    (2006.01)
(Continued)

(52) U.S. Cl.
CPC .............. *H02K 7/14* (2013.01); *H02K 5/225* (2013.01); *H02K 11/33* (2016.01); *H05K 7/20172* (2013.01)

(58) Field of Classification Search
CPC .......... H02K 7/14; H02K 5/225; H02K 11/33; H02K 9/04; H05K 7/20172; H02P 29/00
(Continued)

(56) References Cited

U.S. PATENT DOCUMENTS

2010/0247301 A1* 9/2010 Hatozaki ............ H05K 7/20918
415/182.1
2019/0141857 A1* 5/2019 Yamamoto ................ F16B 2/04
(Continued)

FOREIGN PATENT DOCUMENTS

JP    4550919 B2 *  9/2010
JP    4550919 B2    9/2010
(Continued)

OTHER PUBLICATIONS

An Office Action; "Notification of Reasons for Refusal," mailed by the Japanese Patent Office dated Mar. 17, 2020, which corresponds to Japanese Patent Application No. 2018-074956 and is related to U.S. Appl. No. 16/376,770 with English language translation.

*Primary Examiner* — Ahmed Elnakib
(74) *Attorney, Agent, or Firm* — Studebaker & Brackett PC

(57) ABSTRACT

An object is to provide a motor drive device in which the maintenance accessibility of a fan motor is excellent. A motor drive device includes a second turning engagement unit which is engaged with a first turning engagement unit, which is engaged with the first turning engagement unit and is disengaged therefrom by movement of a first fan unit in a direction intersecting a horizontal direction and in which in an engaged state, where the second turning engagement unit is engaged with the first turning engagement unit, the second turning engagement unit pivotally supports the turning movement of the first fan unit, and in the engaged state, the first fan unit is engaged with a housing such that the first fan unit can be moved to be turned about a predetermined turning axis both to a non-fitting position in which a first connector is not fitted to a second connector and to a fitting position in which the first connector is fitted to the second connector.

10 Claims, 33 Drawing Sheets

(51) Int. Cl.
*H02K 5/22* (2006.01)
*H02K 11/33* (2016.01)

(58) Field of Classification Search
USPC .................................................... 310/71, 89
See application file for complete search history.

(56) References Cited

U.S. PATENT DOCUMENTS

2019/0312486 A1* 10/2019 Yamamoto ............. H02K 11/33
2020/0370565 A1* 11/2020 Odauchi ............... F04D 19/002

FOREIGN PATENT DOCUMENTS

| JP | 2012-244657 A | 12/2012 |
| JP | 2012244657 | * 12/2012 |

* cited by examiner

MOTOR DRIVE DEVICE

This application is based on and claims the benefit of priority from Japanese Patent Application No. 2018-074956, filed on 9 Apr. 2018, the content of which is incorporated herein by reference.

BACKGROUND OF THE INVENTION

Field of the Invention

The present invention relates to motor drive devices.

Related Art

Conventionally, fan motor for heat dissipation is attached to a motor drive device which is mounted on a control panel or a power magnetics cabinet. Since the life of the fan motor is lowered by long term use, periodic maintenance operations such as an inspection and a replacement are needed.

In this regard, a motor drive device is proposed in which in order for an inspection and a replacement to be efficiently performed on a fan motor, for example, a unit including the fan motor is pulled upward or forward such that the unit is removable from a housing (see, for example, Patent Document 1).

Patent Document 1: Japanese Patent No. 4550919

SUMMARY OF THE INVENTION

However, when in the motor drive device disclosed in Patent Document 1, for example, a unit including a fan motor is moved upward so as to be removed from a housing, a maintenance space for the movement of the unit upward of the housing has been required. In general, in an upper side of a motor drive device, the top of a power magnetics cabinet or the like is present, and thus it was difficult to acquire a wide maintenance space in an upper portion. When the maintenance space in the upper portion is narrow, the accessibility of a maintenance operation for removing the unit is disadvantageously degraded.

For example, when a unit including a fan motor is moved forward so as to be removed from a housing, a maintenance space for the movement of the unit forward of the housing is needed. Furthermore, a part or the like has been disadvantageously unable to be arranged in the direction of movement of the unit (the front side of the housing with respect to the unit).

An object of the present invention is to provide a motor drive device in which the maintenance accessibility of a fan motor is excellent.

(1) The present invention provides a motor drive device (for example, a motor drive device 1 which will be described later) that includes: a housing (for example, a housing 10 which will be described later); a first fan unit (for example, a first fan unit 20 which will be described later) which is removably arranged in the upper surface or the lower surface of the housing and which includes a first fan motor (for example, a first fan motor 21 which will be described later), a first connector (for example, a first connector 23 which will be described later) that is electrically connected to the first fan motor and a first turning engagement unit (for example, a first turning engagement unit 25 which will be described later) that engages with the housing; and a printed circuit board (for example, a printed circuit board 30 which will be described later) which is arranged so as to be stored in the housing and which includes a second connector (for example, a second connector 33 which will be described later) that is fitted to the first connector in a state where the first fan unit is fitted, where the housing includes a second turning engagement unit (for example, a second turning engagement unit 15 which will be described later) which engages with the first turning engagement unit.

(2) Preferably, the second turning engagement unit is engaged with the first turning engagement unit and is disengaged therefrom by movement of the first fan unit in a direction intersecting a horizontal direction, in an engaged state where the second turning engagement unit is engaged with the first turning engagement unit, the second turning engagement unit pivotally supports a turning movement of the first fan unit and in the engaged state, the first fan unit is engaged with the housing such that the first fan unit can be moved to be turned about a predetermined turning axis (for example, a turning axis K which will be described later) both to a non-fitting position in which the first connector is not fitted to the second connector and to a fitting position in which the first connector is fitted to the second connector.

(3) The present invention provides a motor drive device (for example, a motor drive device 1A which will be described later) that includes: a housing (for example, a housing 10A which will be described later); a first fan unit (for example, a first fan unit 20A which will be described later) which is removably arranged in the upper surface or the lower surface of the housing and which includes a first fan motor (for example, a first fan motor 21 which will be described later), a first connector (for example, a first connector 23 which will be described later) that is electrically connected to the first fan motor, a third connector (for example, a third connector 24 which will be described later) that is electrically connected to the first connector and a first turning engagement unit (for example, a first turning engagement unit 25 which will be described later) that engages with the housing; a second fan unit (for example, a second fan unit 40 which will be described later) which is arranged side by side with the first fan unit in a horizontal direction and which includes a second fan motor (for example, a second fan motor 41 which will be described later) and a fourth connector (for example, a fourth connector 44 which will be described later) that is electrically connected to the second fan motor; and a printed circuit board (for example, a printed circuit board 30 which will be described later) which is arranged so as to be stored in the housing and which includes a second connector (for example, a second connector 33 which will be described later) that is fitted to the first connector in a state where the first fan unit is fitted, where the housing or the second fan unit includes a second turning engagement unit (for example, a second turning engagement unit 15 which will be described later) which engages with the first turning engagement unit.

(4) Preferably, the second turning engagement unit is engaged with the first turning engagement unit and is disengaged therefrom by movement of the first fan unit in a direction intersecting the horizontal direction, in an engaged state where the second turning engagement unit is engaged with the first turning engagement unit, the second turning engagement unit pivotally supports a turning movement of the first fan unit and in the engaged state, the first fan unit is engaged with the housing such that the first fan unit can be moved to be turned about a predetermined turning axis (for example, a turning axis K which will be described later) both to a non-fitting position in which the first connector is not fitted to the second connector and in which the third connector is not fitted to the fourth connector and to a fitting position in which the first connector is fitted to the second connector and in which the third connector is fitted to the fourth connector.

(5) The present invention provides a motor drive device (for example, a motor drive device 1B which will be described later) that includes: a housing (for example, a housing 10B which will be described later); a first fan unit (for example, a first fan unit 20B which will be described later) which is removably arranged in the upper surface or the lower surface of the housing and which includes a first connector (for example, a first connector 23B which will be described later), a third connector (for example, a third connector 24B which will be described later) that is electrically connected to the first connector and a first turning engagement unit (for example, a first turning engagement unit 25B which will be described later) that engages with the housing; a second fan unit (for example, a second fan unit 40B which will be described later) which is arranged side by side with the first fan unit in a horizontal direction and which includes a second fan motor (for example, a second fan motor 41B which will be described later) and a fourth connector (for example, a fourth connector 44B which will be described later) that is electrically connected to the second fan motor; and a printed circuit board (for example, a printed circuit board 30B which will be described later) which is arranged so as to be stored in the housing and which includes a second connector (for example, a second connector 33B which will be described later) that is fitted to the first connector in a state where the first fan unit is fitted, where the housing or the second fan unit includes a second turning engagement unit (for example, a second turning engagement unit 15B which will be described later) which engages with the first turning engagement unit.

(6) Preferably, the second turning engagement unit is engaged with the first turning engagement unit and is disengaged therefrom by movement of the first fan unit in a direction intersecting the horizontal direction, in an engaged state where the second turning engagement unit is engaged with the first turning engagement unit, the second turning engagement unit pivotally supports a turning movement, of the first fan unit and in the engaged state, the first fan unit is engaged with the housing such that the first fan unit can be moved to be turned about a predetermined turning axis (for example, a turning axis K which will be described later) both to a non-fitting position in which the first connector is not fitted to the second connector and in which the third connector is not fitted to the fourth connector and to a fitting position in which the first connector is fitted to the second connector and in which the third connector is fitted to the fourth connector.

(7) Preferably, in the motor drive device of any one of (1) to (6), at least one of the first connector and the second connector includes a plate-shaped contact, and at least, one of the third connector and the fourth connector includes a plate-shaped contact.

(8) Preferably, in the motor drive device of any one of (1) to (6), at least one of the first connector and the second connector includes a pad-shaped contact, and at least one of the third connector and the fourth connector includes a pad-shaped contact.

(9) Preferably, in the motor drive device of any one of (3) to (8), a first fitting direction which is the direction of movement of the first connector when the first connector is fitted to the second connector and a second fitting direction which is the direction of movement of the third connector when the third connector is fitted to the fourth connector are different from each other.

(10) Preferably, in the motor drive device of any one of (3) to (9), a first fitting direction which is the direction of movement of the first connector when the first connector is fitted to the second connector and a second fitting direction which is the direction of movement of the third connector when the third connector is fitted to the fourth connector are substantially the same as each other.

(11) Preferably, in the motor drive device of any one of (1) to (10), the first fan unit includes a first fan cover (for example, a first fan cover 28 which will be described later), and the first fan cover includes a fitting portion (for example, a fitting portion 26 which will be described later) which is fitted to the housing.

(12) Preferably, in the motor drive device of any one of (1) to (11), the first fan unit is removable with respect to the housing from obliquely forward of the housing.

(13) Preferably, in the motor drive device of any one of (3) to (12), the second fan unit is formed such that in a state where the first fan unit is removed from the housing, a fixing portion (for example, a fixing portion 45a, 45b, 45c which will be described later) for fixing the second fan unit to the housing can be accessed from a front surface of the motor drive device and that the fixing by the fixing portion can be released.

(14) Preferably, in the motor drive device of (13), the second fan unit includes a second fan cover, and the fixing portion is partially covered by the second fan cover.

(15) Preferably, in the motor drive device of any one of (3) to (14), the housing includes a storage region (for example, a storage region H which will be described later) Which stores the first fan unit arranged in the fitting position and which forms part of a movement path through which the second fan unit is fitted and removed in a state where the first fan unit is removed.

(16) Preferably, in the motor drive device of any one of (3) to (15), the housing includes, in an upper surface, an inclined surface portion (for example, an inclined surface portion 11 which will be described later) which guides at least one of the first fan unit and the second fan unit from obliquely forward of the housing toward backward.

(17) Preferably, in the motor drive device of any one of (1) to (16), a first fitting surface (for example, a first fitting surface MC which will be described later) which is a contact root surface of the first connector fitted to the second connector and/or a second fitting surface which is a contact root surface of the third connector fitted to the fourth connector is located on a plane that is substantially the same as a turning plane (for example, a turning plane MK which will be described later) including a turning axis.

(18) Preferably, in the motor drive device of any one of (1) to (17), at least one of the first connector and the second connector includes a connector holding unit (for example, a connector holding unit 231 which will be described later) which movably holds the connector so as to absorb a backlash.

(19) Preferably, in the motor drive device of any one of (3) to (18), at least one of the third connector and the fourth connector includes a connector holding unit which movably holds the connector so as to absorb a backlash.

According to the present invention, it is possible to provide a motor drive device in which the maintenance accessibility of a fan motor is excellent.

DETAILED DESCRIPTION OF THE INVENTION

Figure 1:
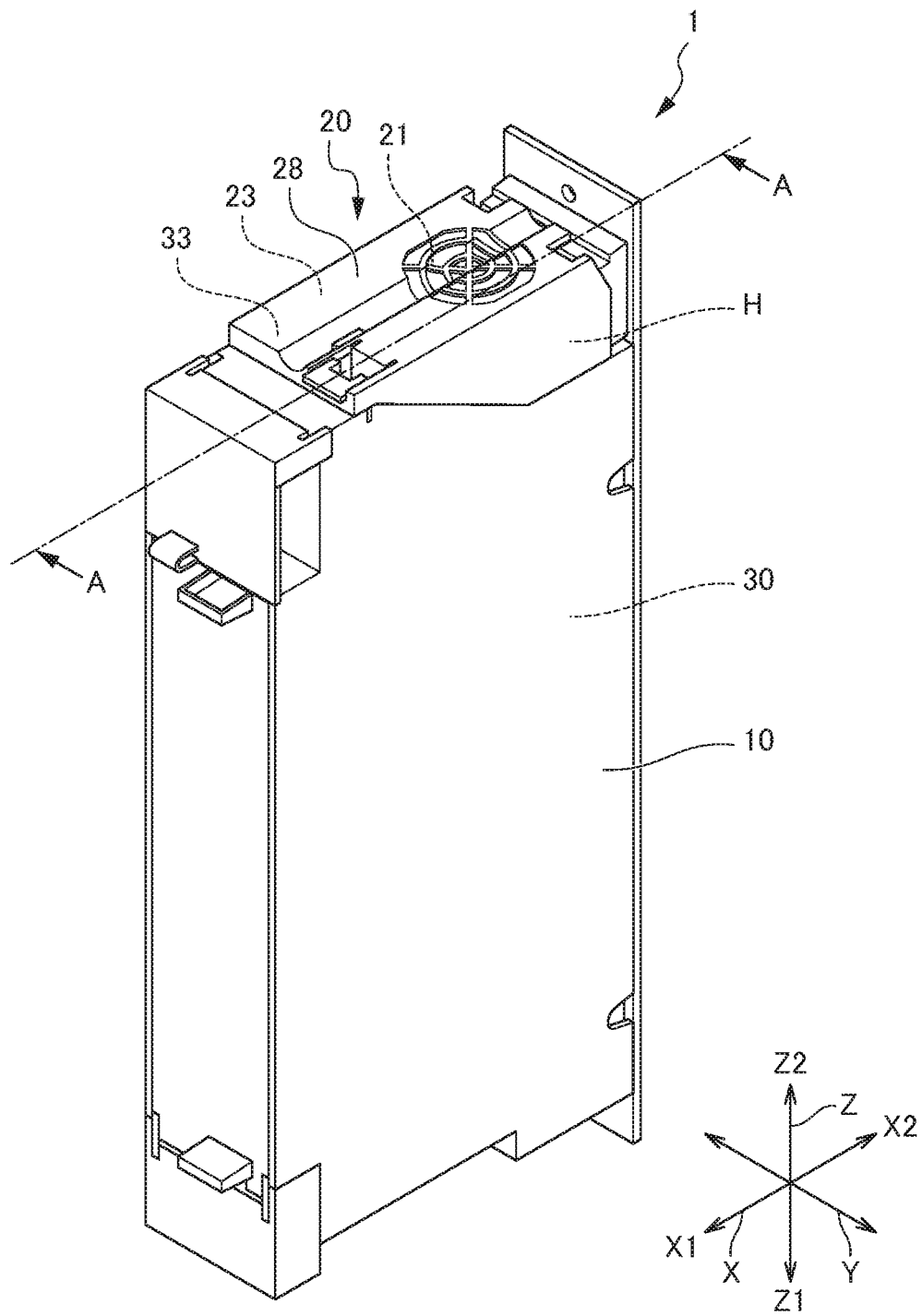
FIG. 1 is a perspective view of a motor drive device in a first embodiment.

Embodiments of the present invention will be described below with reference to drawings. In the description of the second and subsequent embodiments, the same configurations as in the first embodiment are identified with the same reference numerals, and the description thereof will be omitted. The configurations of the individual embodiments below can be combined as required and applied to the other embodiments.

First Embodiment

Figure 2:
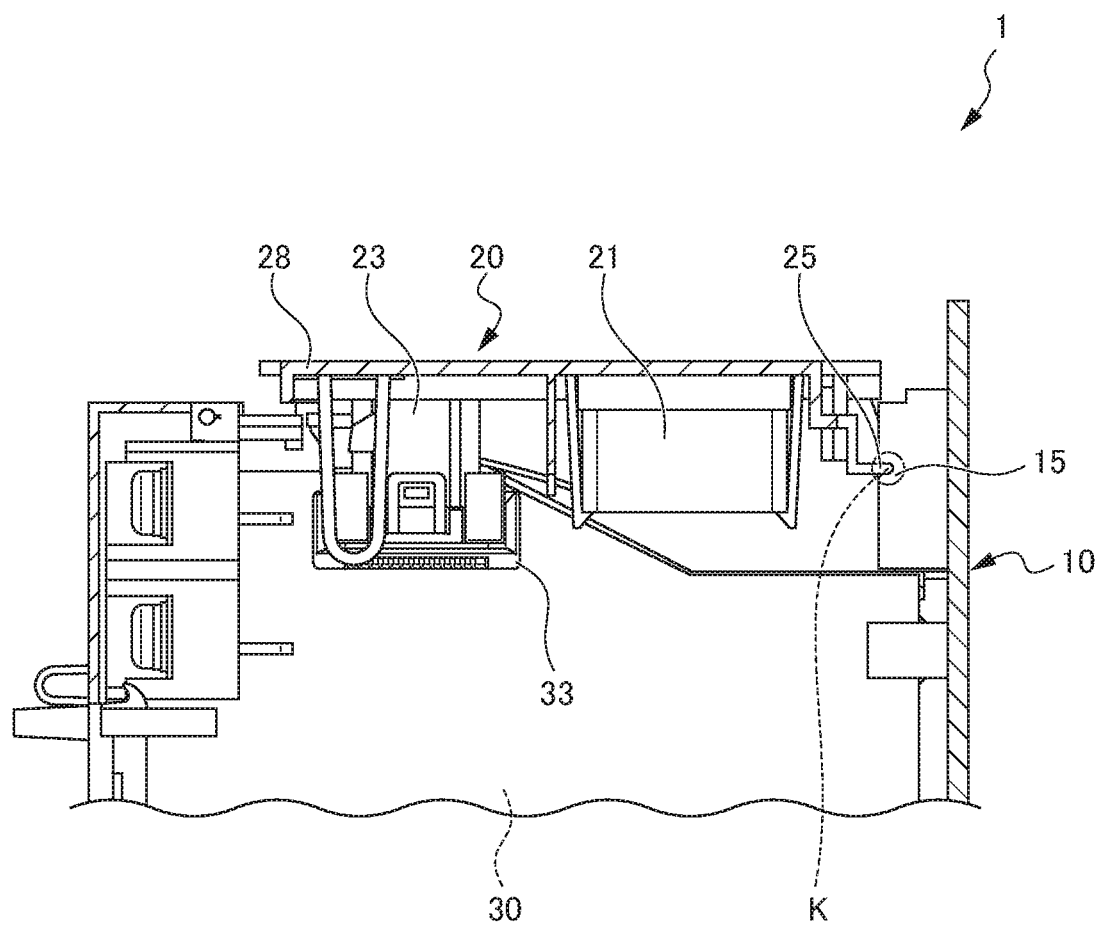
FIG. 2 is a cross-sectional view taken along line A-A in FIG. 1.
Figure 3:
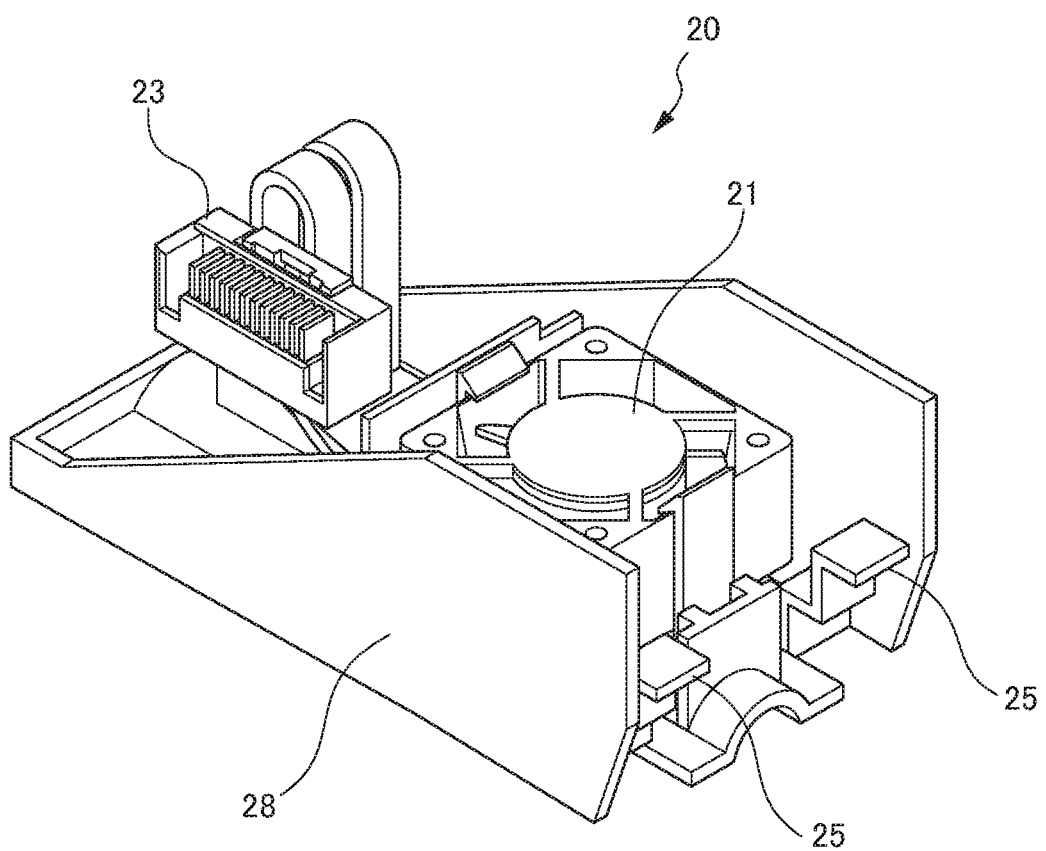
FIG. 3 is a diagram illustrating the configuration of a first fan unit in the first embodiment.

A motor drive device 1 in the first embodiment of the present invention will first be described with reference to FIGS. 1 to 3. FIG. 1 is a perspective view of the motor drive device in the first embodiment. FIG. 2 is a cross-sectional view taken along line A-A in FIG. 1. FIG. 3 is a diagram illustrating the configuration of a first fan unit in the first embodiment.

As shown in FIGS. 1 to 3, the motor drive device 1 includes a housing 10, the first fan unit 20 and a printed circuit board 30. The motor drive device 1 of the present embodiment is a motor drive device which includes one fan unit.

As shown in FIGS. 1 and 2, the housing 10 is formed substantially in the shape of a rectangular parallelepiped whose length in a width direction Y is short (for example, short as compared with the motor drive device of a third embodiment). The housing 10 stores the printed circuit board 30 therewithin. The first fan unit 20 is fitted to an upper portion of the housing 10 in a vertical direction Z. The housing 10 includes second turning engagement units 15, 15 for fitting and removing the first fan unit 20.

The second turning engagement units 15, 15 are engaged units which are engaged with first turning engagement units 25, 25 formed in the first fan unit 20 to be described later and which are formed in a concave shape. The first fan unit 20 is moved in a direction (oblique direction) intersecting a forward/backward direction X (horizontal direction), and thus the second turning engagement units 15, 15 are engaged with the first turning engagement units 25, 25 and are disengaged therefrom. Specifically, when the first fan unit 20 is moved in an obliquely downward direction intersecting the forward/backward direction X (horizontal direction), the second turning engagement units 15, 15 are engaged with the first turning engagement units 25, 25 whereas when the first fan unit 20 is moved in an obliquely upward direction, the second turning engagement units 15, 15 are disengaged therefrom.

In an engaged state where the second turning engagement units 15, 15 are engaged with the first turning engagement units 25, 25 to be described later, the second turning engagement units 15, 15 pivotally support a turning movement about the turning axis K of the first fan unit 20.

As shown in FIGS. 1 to 3, the first fan unit 20 is removably arranged in the upper surface or the lower surface of the housing 10 in the vertical direction Z. In the present embodiment, the first fan unit 20 is arranged in the upper surface of the housing 10 in the vertical direction Z. The first fan unit 20 is formed so as to be removable with respect to the housing 10. For example, the first fan unit 20 which is fitted into a storage region H is formed such that when the first fan unit 20 is moved obliquely upward (the Z2 side in the vertical direction Z) toward the front side (X1 side) of the housing 10 in the forward/backward direction X, the first fan unit 20 can be removed from the housing 10.

The first fan unit 20 includes a first fan motor 21, a first connector 23 which is electrically connected to the first fan motor 21, the first turning engagement units 25, 25 which are engaged with the housing 10 (the second turning engagement units 15, 15) and a first fan cover 28.

The first fan motor 21 is attached to the first fan cover 28 and is connected to the first connector 23. The first fan motor 21 is driven and controlled by an electrical signal from the first connector 23 fitted a second connector 33 which will be described later.

The first connector 23 is attached to the first fan cover 28 and is electrically connected to the first fan motor 21. The first connector 23 is arranged only a predetermined distance apart from the first turning engagement units 25, 25. The first connector 23 is arranged at the time of fitting such that a contact is directed downward in the vertical direction Z. The first connector 23 is fitted to the second connector 33 to be described later in a state where the first fan unit 20 is fitted to the housing 10. The first connector 23 outputs an electrical signal from the second connector 33 to the first fan motor 21.

As described previously, the first turning engagement units 25, 25 are engagement units which engage with the second turning engagement units 15, 15 and which are formed in a protruded shape. The first fan unit 20 is moved in a direction (oblique direction) intersecting the forward/backward direction X (horizontal direction), and thus the first turning engagement units 25, 25 engage with the second turning engagement units 15, 15 and disengage therefrom. Specifically, when the first fan unit 20 is moved in an obliquely downward direction intersecting the forward/backward direction X (horizontal direction), the first turning engagement units 25, 25 engage with the second turning engagement units 15, 15 whereas when the first fan unit 20 is moved in an obliquely upward direction, the first turning engagement units 25, 25 disengage therefrom.

Then, in the engaged state where the first turning engagement units 25, 25 engage with the second turning engagement units 15, 15, the first fan unit 20 is engaged with the housing 10 such that the first fan unit 20 can be moved to be turned about the predetermined turning axis K both to a non-fitting position in which the first connector 23 is not fitted to the second connector 33 and to a fitting position in which the first connector 23 is fitted to the second connector 33.

The first fan motor 21, the first connector 23 and the first turning engagement units 25, 25 are attached to the first fan cover 28. In a state where the first fan unit 20 is fitted to the housing 10, the first fan cover 28 forms the outside shape of the motor drive device 1 together with the housing 10. The first fan cover 28 is locked to the housing 10 with, for example, a latch which is not shown.

As shown in FIGS. 1 and 2, the printed circuit board 30 is arranged so as to be stored in the housing 10. The printed circuit board 30 is a plate-shaped member on which electronic parts and an electrical circuit are mounted. In the present embodiment, the printed circuit board 30 is arranged along the forward/backward direction X (such that its surface is perpendicular to the width direction Y). The printed circuit board 30 includes the second connector 33.

The second connector 33 is fitted to the first connector 23 in a state where the first fan unit 20 is fitted to the housing 10. The second connector 33 is electrically connected to a control unit and a power supply unit which are mounted on the printed circuit board 30 and which are not shown, and an electrical signal from the control unit and power from the power supply unit are supplied to the first fan motor 21 through the first connector 23 fitted to the second connector 33.

Here, the contact of the first connector 23 and the contact of the second connector 33 are preferably formed in the shape of, for example, a plate such that suitable fitting is achieved even in a turning movement or the like. A specific description will be given in the second embodiment.

Figure 4A:
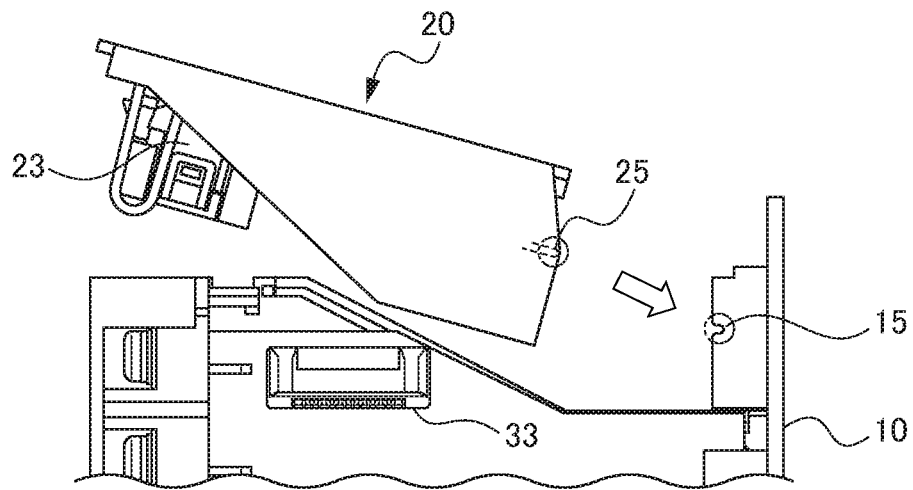
FIG. 4A is a diagram illustrating an operation of attaching the first fan unit to a housing in the first embodiment, and is a diagram illustrating an operation of moving the first fan unit obliquely downward so as to attach it to the housing.

Next, an operation of attaching the first fan unit of the first embodiment to the housing will be described with reference to FIGS. 4A to 4C. FIG. 4A is a diagram illustrating an operation of moving the first fan unit obliquely downward so as to attach it to the housing, FIG. 4B is a diagram illustrating a state where the first turning engagement units are engaged with the second turning engagement units and FIG. 4C is a diagram illustrating a state where the first fan unit is moved to be turned about the turning axis K and is arranged in the fitting position.

As shown in FIG. 4A, an operator first inserts the first fan unit 20 from the front side (the X1 side in the forward/backward direction X in FIG. 1) into the upper surface (the Z2 side in the vertical direction Z in FIG. 1) of the housing 10, and moves the first fan unit 20 to the downward side (obliquely downward side) in a direction intersecting the horizontal direction.

Figure 4B:
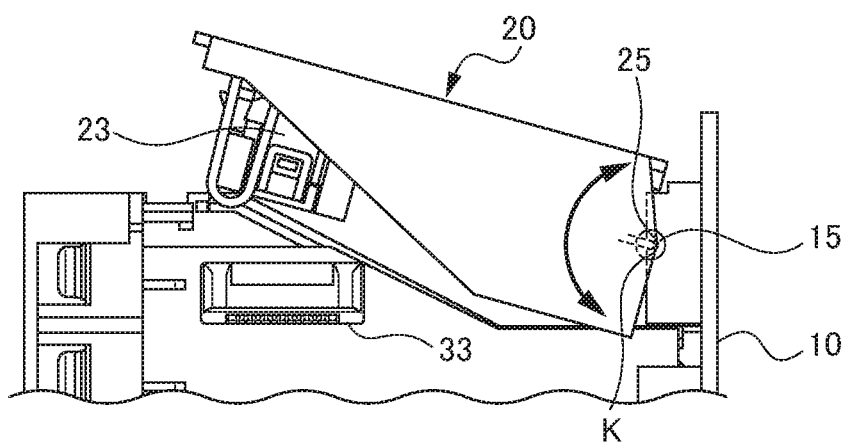
FIG. 4B is a diagram illustrating the operation of attaching the first fan unit to the housing in the first embodiment, and is a diagram illustrating a state where first turning engagement units are engaged with second turning engagement units.

Then, as shown in FIG. 4B, the operator moves the first fan unit 20 so as to engage the first turning engagement units 25, 25 with (insert the first turning engagement units 25, 25 into) the second turning engagement units 15, 15. In a state where the first turning engagement units 25, 25 are engaged with (inserted into) the second turning engagement units 15, 15, the first fan unit 20 is attached to the housing 10 such that the first fan unit 20 can be turned about the turning axis K.

Figure 4C:
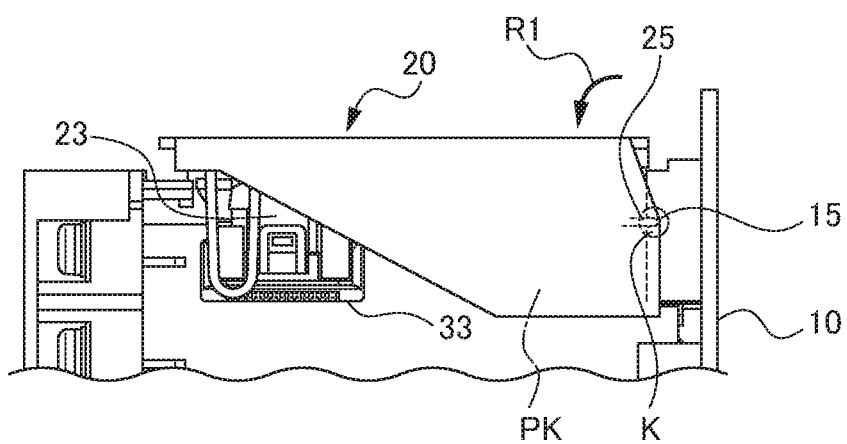
FIG. 4C is a diagram illustrating the operation of attaching the first fan unit to the housing in the first embodiment, and is a diagram illustrating a state where the first fan unit is moved to be turned about a turning axis K and is arranged in a fitting position.

Then, as shown in FIG. 4C, the operator moves and turns the first fan unit 20 in the direction of an arrow R1. Specifically, the first fan unit 20 is moved from the non-fitting position in which the first connector 23 is not fitted to the second connector 33 to the fitting position in which the first connector 23 is fitted to the second connector 33. In this way, the first fan unit 20 is fitted to the housing 10.

In the present embodiment, the following effects are achieved. In the present embodiment, in the motor drive device, the housing includes the second turning engagement units which are engaged with the first turning engagement units, which are engaged with the first turning engagement units and are disengaged therefrom by the movement of the first fan unit in a direction (oblique direction) intersecting the horizontal direction and which pivotally support the turning movement of the first fan unit in the engaged state where the second turning engagement units are engaged with the first turning engagement units. Then, in the engaged state, the first fan unit, is engaged with the housing such that the first fan unit can be moved to be turned about the predetermined turning axis both to the non-fitting position in which the first connector is not fitted to the second connector and to the fitting position in which the first connector is fitted to the second connector.

In this way, the motor drive device is formed such that the first fan unit can be removed from the housing by being pulled obliquely upward. In this way, in the motor drive device, a maintenance space required in the upper side thereof in the vertical direction can be reduced in size. In this way, the motor drive device is excellent in the maintainability of the fan motor.

The motor drive device is formed such that the first fan unit can be removed from the housing by being pulled obliquely upward, and thus parts and the like can be mounted on the front side (the X1 side in the forward/backward direction X in FIG. 1) of the first fan unit.

In other words, in the present embodiment, the first fan unit is formed such that the first fan unit is removable from obliquely forward of the housing with respect to the housing, and thus it is not required to remove a short bar which connects the adjacent terminals of the motor drive device. Hence, the accessibility of fitting and removal of the fan unit can be enhanced.

Second Embodiment

Figure 5:
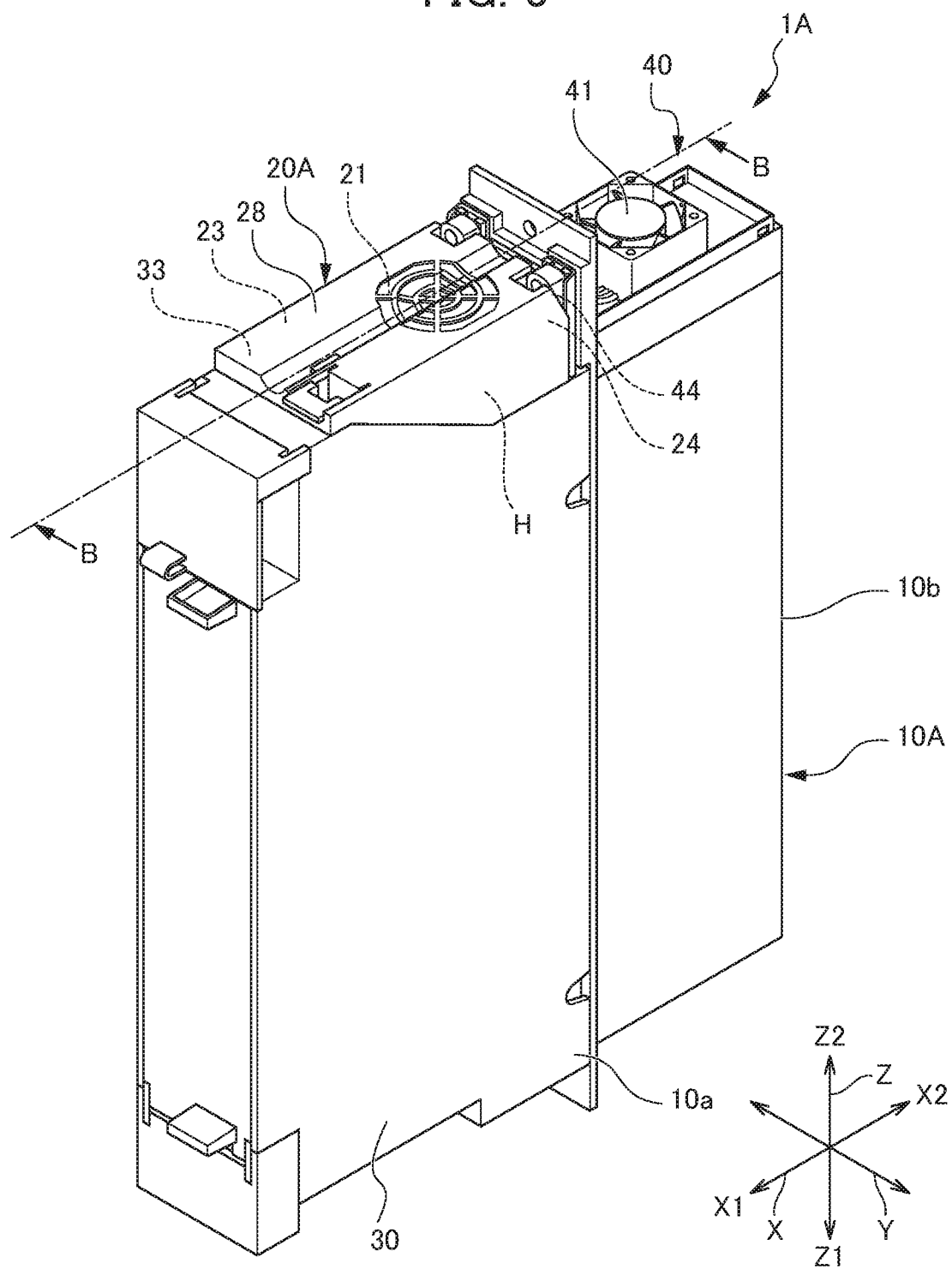
FIG. 5 is a perspective view of a motor drive device in a second embodiment.
Figure 6:
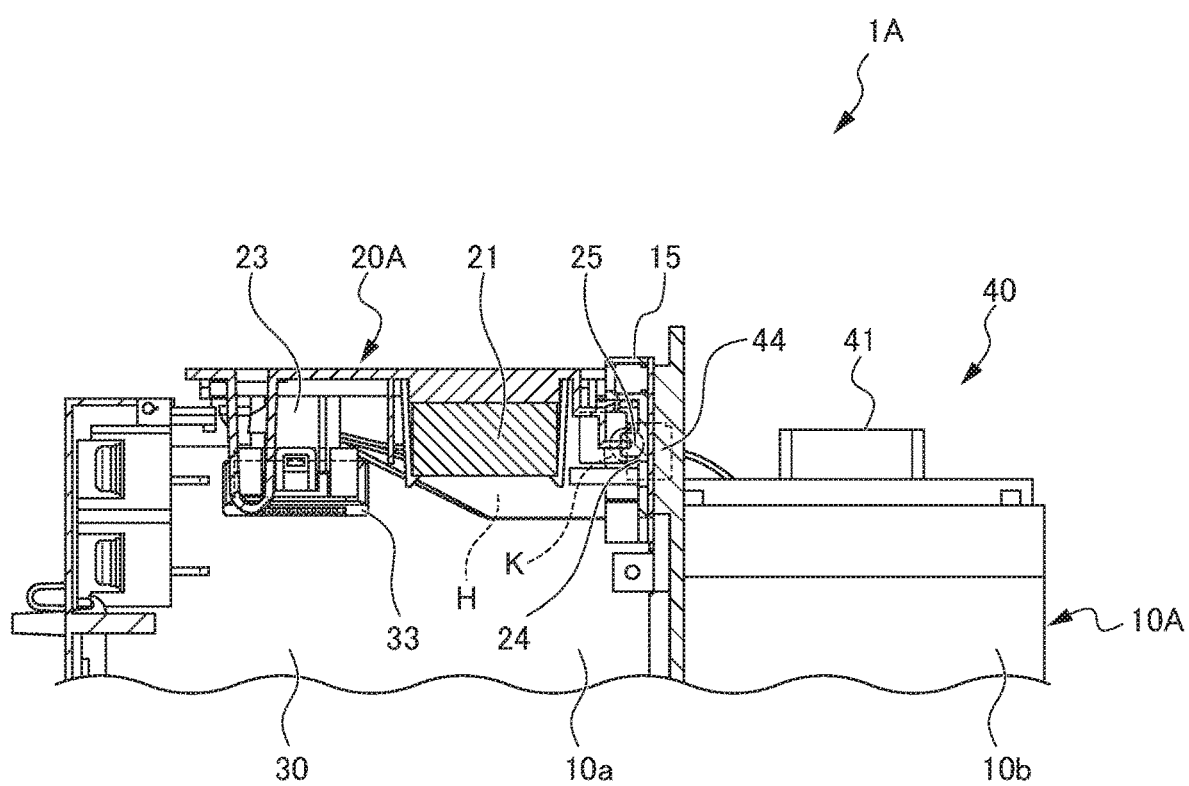
FIG. 6 is a cross-sectional view taken along line B-B in FIG. 5.
Figure 7:
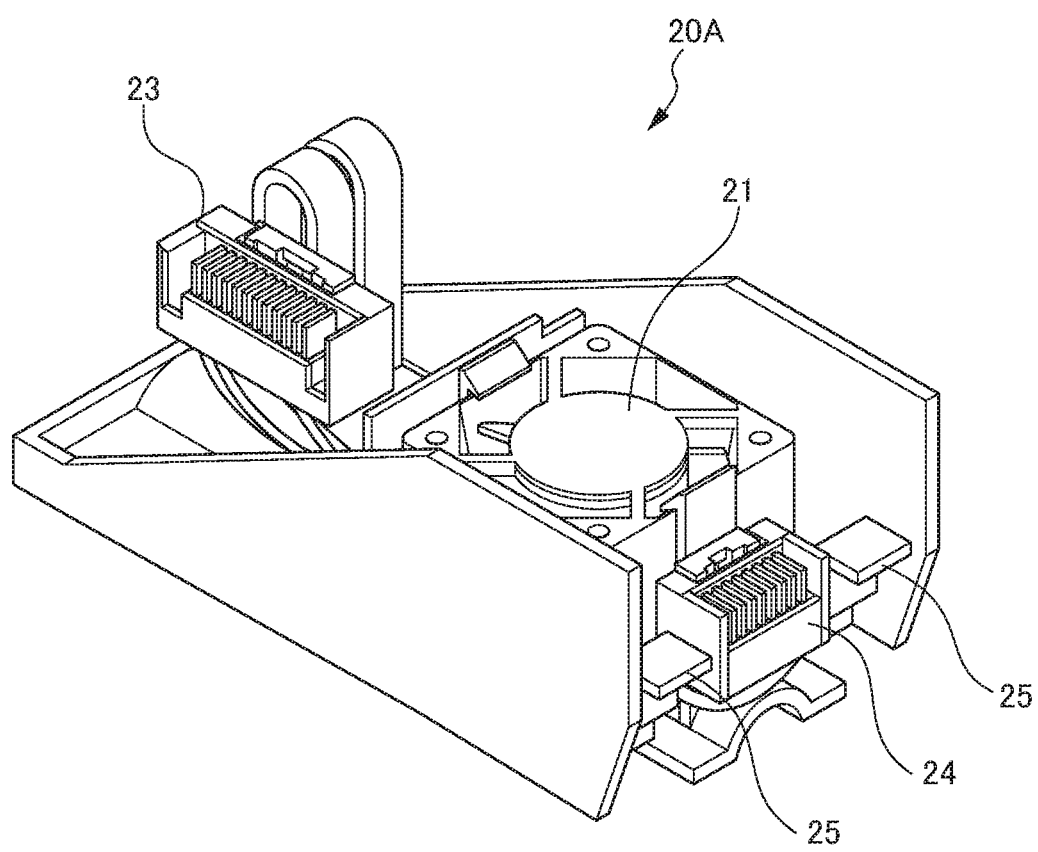
FIG. 7 is a diagram illustrating the configuration of a first fan unit in the second embodiment.
Figure 8:
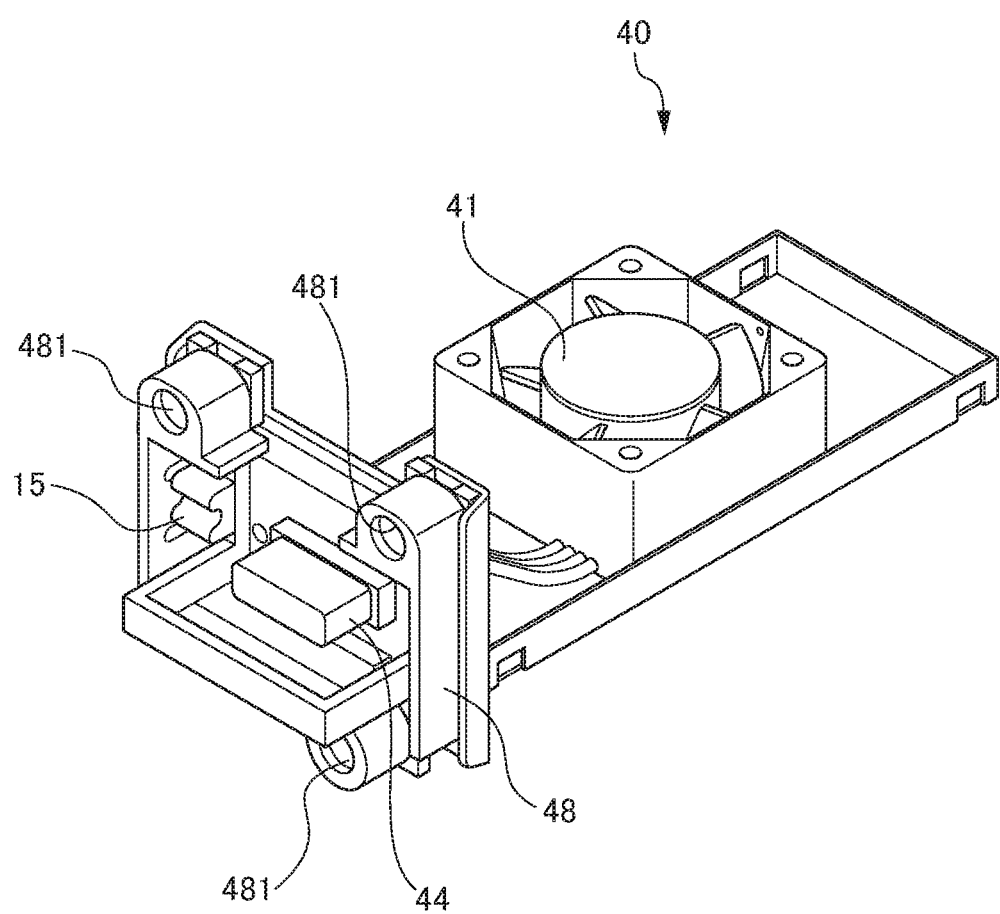
FIG. 8 is a diagram illustrating the configuration of a second fan unit in the second embodiment.
Figure 9:
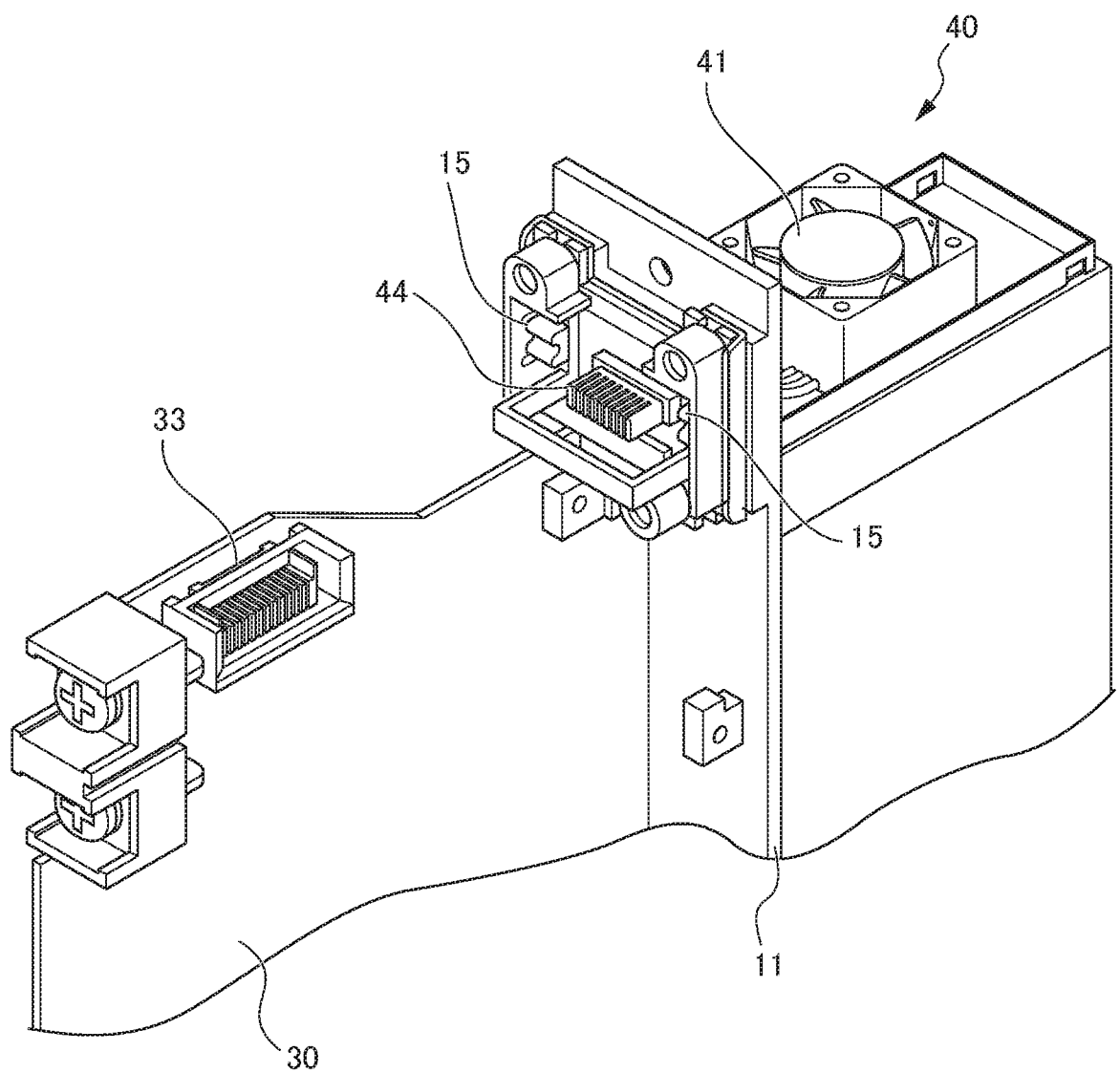
FIG. 9 is a diagram illustrating the arrangement of a second connector and a fourth connector in the second embodiment.
Figure 10:
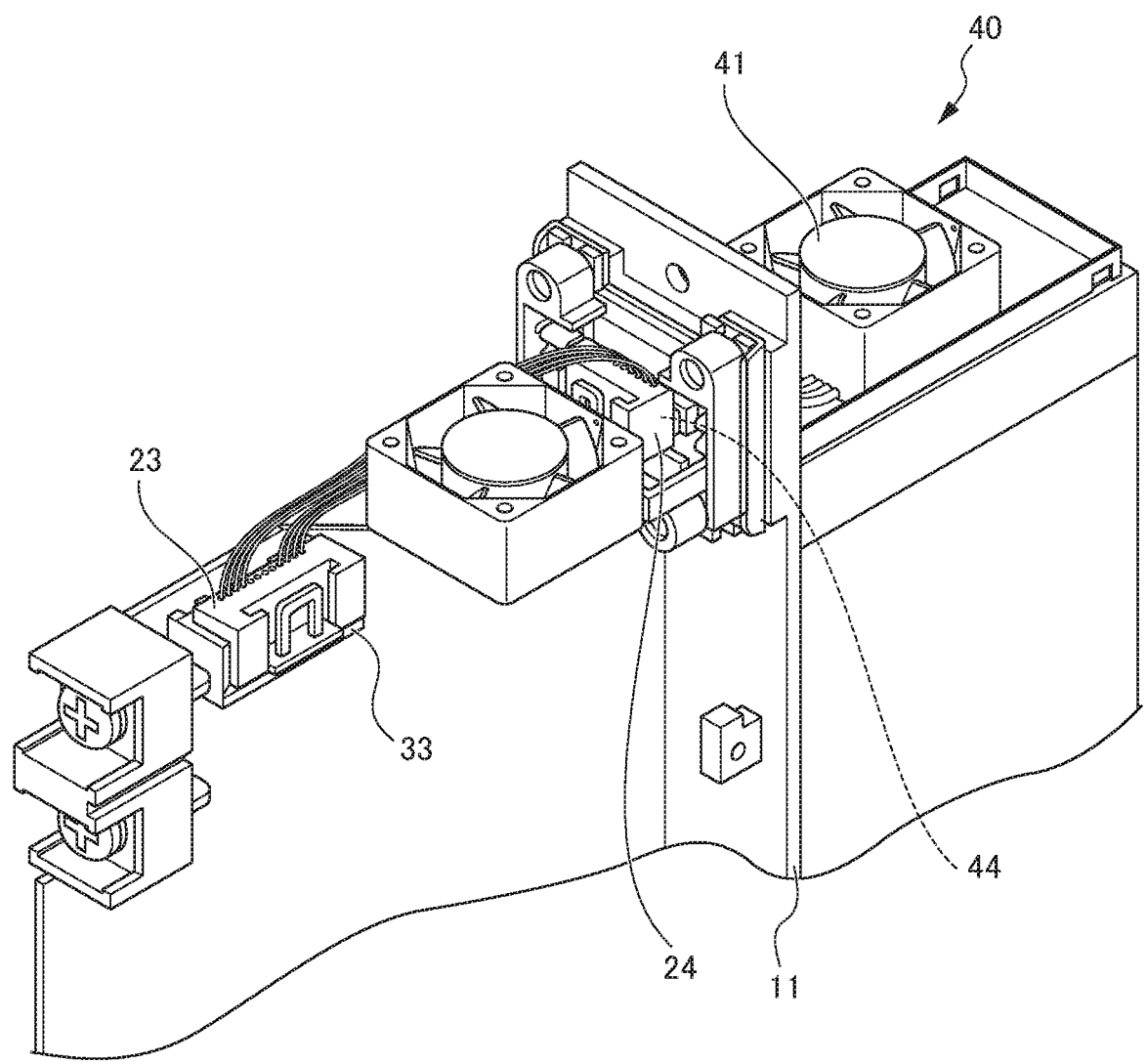
FIG. 10 is a diagram showing a state where a first connector and the second connector are fitted together and the second connector and the fourth connector are fitted together in the second embodiment.
Figure 11:
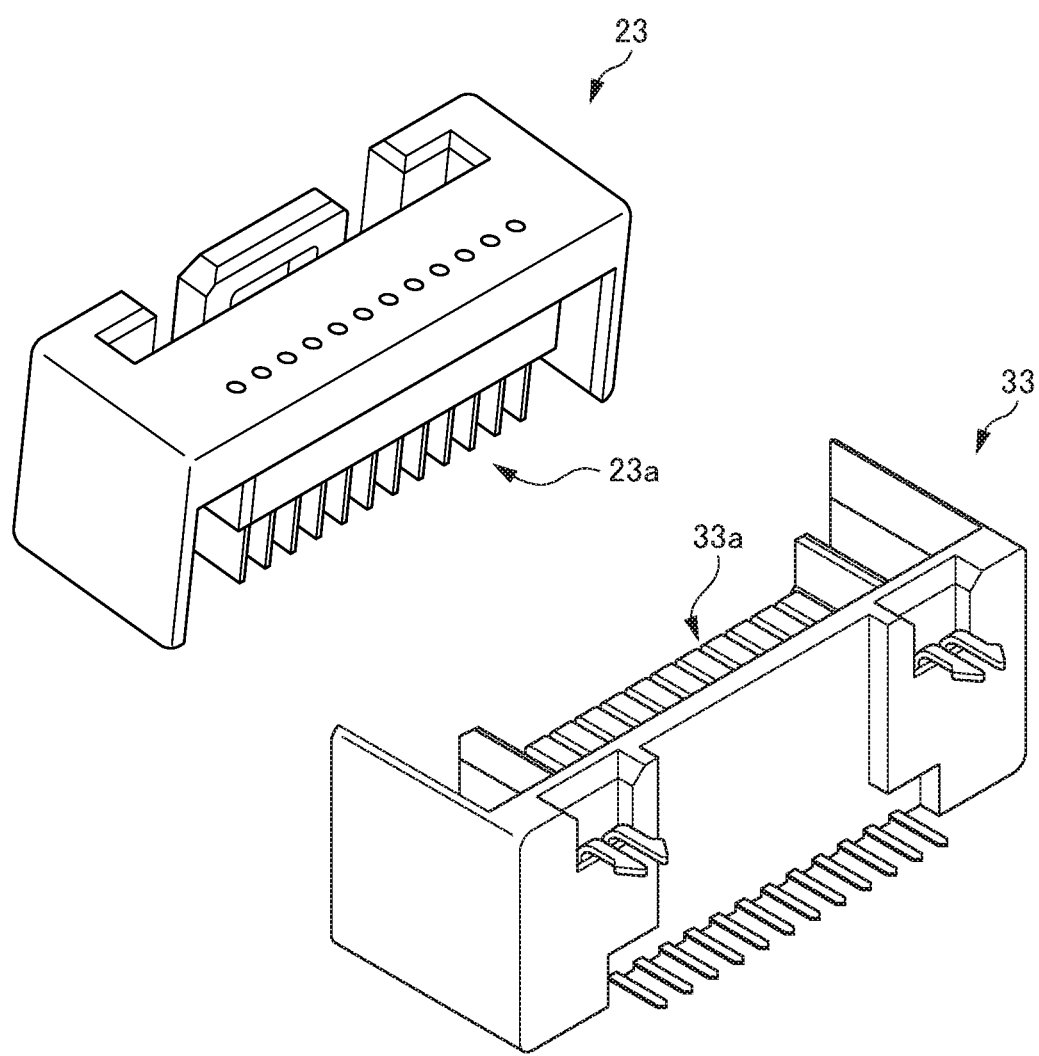
FIG. 11 is a diagram showing the configuration of the first connector and the second connector.
Figure 12:
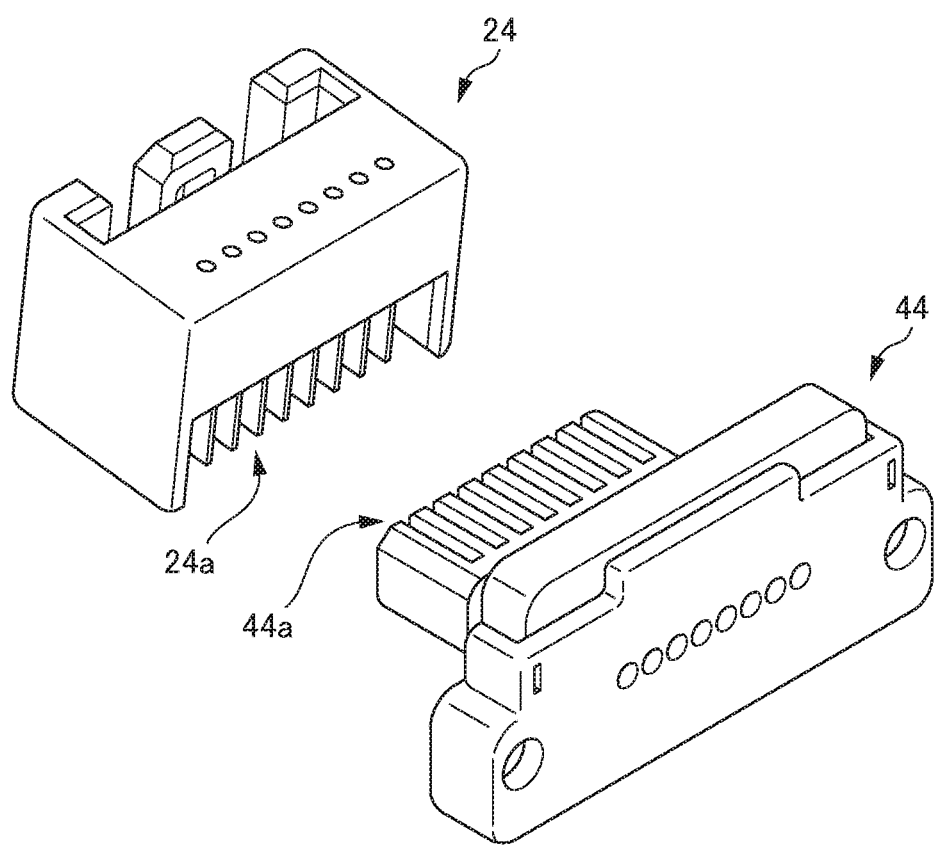
FIG. 12 is a diagram showing the configuration of a third connector and the fourth connector.

Next, the motor drive device 1A of the second embodiment will be described with reference to FIGS. 5 to 12. FIG. 5 is a perspective view of the motor drive device in the second embodiment. FIG. 6 is a cross-sectional views taken along line B-B in FIG. 5. FIG. 7 is a diagram illustrating the configuration of a first fan unit in the second embodiment. FIG. 8 is a diagram illustrating the configuration of a second fan unit in the second embodiment. FIG. 9 is a diagram illustrating the arrangement of a second connector and a fourth connector in the second embodiment. FIG. 10 is a diagram showing a state where a first connector and the second connector are fitted together and the second connector and the fourth connector are fitted together in the second embodiment. FIG. 11 is a diagram showing the configuration of the first connector and the second connector. FIG. 12 is a diagram showing the configuration of a third connector and the fourth connector. In the following discussion, configurations which differ from the first embodiment will be described, and the description of the same configurations as in the first embodiment will be omitted.

As shown in FIGS. 5 to 12, the motor drive device 1A includes a housing 10A, a first fan unit 20A, a second fan unit 40 and a printed circuit board 30. The motor drive device 1A of the present, embodiment is a motor drive device which includes two fan units.

As shown in FIGS. 5 and 6, the housing 10A is formed substantially in the shape of a rectangular parallelepiped whose length in the width direction Y is short (for example, short as compared with the motor drive device of the third embodiment). The housing 10A includes a first housing 10a and a second housing 10b. The first housing 10a stores the printed circuit board 30 therewithin. The first fan unit 20A is fitted to an upper portion of the first housing 10a in the vertical direction Z.

The second housing 10b is arranged side by side with the back side (X2 side) of the first housing 10a in the forward/backward direction X. The second fan unit 40 is fitted to an upper portion of the second housing 10b in the vertical direction Z.

As shown in FIGS. 5 to 7, the first fan unit 20A is removably arranged in the upper surface or the lower surface of the housing 10a in the vertical direction Z. In the present embodiment, the first fan unit 20A is arranged in the upper surface of the first housing 10a in the vertical direction Z. The first fan unit 20A is formed so as to be removable with respect to the first housing 10a. For example, the first fan unit 20A which is fitted into a storage region H is formed such that when the first fan unit 20A is moved obliquely upward (to the Z2 side in the vertical direction Z) toward the front side (X1 side) of the first housing 10a in the forward/backward direction X, the first fan unit 20A can be removed from the first housing 10a.

The first fan unit 20A includes a first fan motor 21, a first connector 23 which is electrically connected to the first fan motor 21, a third connector 24 which is electrically connected to the first connector 23, first turning engagement units 25, 25 which engage with the second fan unit 40 described later (the second turning engagement units 15, 15) and a first fan cover 28.

As shown in FIG. 10, in the present embodiment, the first connector 23 is electrically connected to the first fan motor 21 and is electrically connected to the third connector 24. The first connector 23 is fitted to the second connector 33 in a state where the first fan unit 20 is fitted to the first housing 10a. The first connector 23 outputs an electrical signal from the second connector 33 to the first fan motor 21 and the third connector 24.

As shown in FIGS. 6 and 7, the third connector 24 is arranged close to the first turning engagement units 25, 25. The third connector 24 is arranged at the time of fitting such that a contact is directed to the backward side (X2 side) in the forward/backward direction X. The third connector 24 is electrically connected to the first connector 23. The third connector 24 is fitted to a fourth connector 44 in a state where the first fan unit 20A is fitted to the first housing 10a. The third connector 24 outputs the electrical signal from the second connector 33 through the first connector 23 to the fourth connector 44.

The second connector 33 is fitted to the first connector 23 in a state where the first fan unit 20A is fitted to the housing 10. The second connector 33 is electrically connected to a control unit and a power supply unit which are mounted on the printed circuit board 30 and which are not shown, and an electrical signal from the control unit and power from the power supply unit are supplied to the first fan motor 21 and the fourth connector 44 (the second fan motor 41) through the first connector 23 fitted to the second connector 33.

The second fan unit 40 is arranged side by side with the first fan unit 20A in the horizontal direction (the forward/backward direction X). The second fan unit 40 is arranged on the back side (X2 side) of the first fan unit 20A in the forward/backward direction X. The second fan unit 40 includes the second fan motor 41 and the fourth connector 44 which is electrically connected to the second fan motor 41.

The second fan unit 40 includes second turning engagement units 15, 15 for fitting and removing the first fan unit 20A. Here, the configuration and the action of the second turning engagement units 15, 15 are the same as in the first embodiment described above. The second turning engagement units 15, 15 may be provided to the housing 10A (the first housing 10a) instead of the second fan unit 40.

As shown in FIGS. 6 and 8, the fourth connector 44 is arranged close to the second turning engagement units 15, 15. The fourth connector 44 is arranged at the time of fitting such that a contact, is directed to the forward side (X1 side) in the forward/backward direction X. As shown in FIG. 10, in the present embodiment, the fourth connector 44 is fitted to the third connector 24 in a state where the first fan unit 20A is fitted to the first housing 10a. The fourth connector 44 outputs an electrical signal from the third connector 24 to the second fan motor 41.

As shown in FIGS. 6 and 10, in a state where the first fan unit 20A is fitted to the first housing 10a, the first connector 23 and the second connector 33 are fitted together, and the third connector 24 and the fourth connector 44 are fitted together. In the present embodiment, the first fan unit 20A is attached to the first housing 10a, and thus the two sets of connectors are brought into a fitted state. Specifically, in an engaged state where the first turning engagement units 25, 25 engage with the second turning engagement units 15, 15, the first fan unit 20A is engaged with the first housing 10a such that the first fan unit 20A can be moved to be turned about the turning axis K both to a non-fitting position in which the first connector 23 is not fitted to the second connector 33 and in which the third connector 24 is not fitted to the fourth connector 44 and to a fitting position in which the first connector 23 is fitted to the second connector 33 and in which the third connector 24 is fitted to the fourth connector 44.

As shown in FIG. 11, the contact of the first connector 23 and the contact of the second connector 33 are formed in the shape of a plate. Specifically, the contact of the first connector 23 is formed so as to include a plurality of plate-shaped conductive members 23a which are arranged to be aligned at predetermined intervals. Likewise, the contact of the second connector 33 is formed so as to include a plurality of plate-shaped conductive members 33a which are arranged to be aligned at predetermined intervals. The plate-shaped conductive members 23a of the first connector 23 are inserted and arranged between the plate-shaped conductive members 33a of the second connector 33, and thus the first connector 23 and the second connector 33 are brought into the fitted state. The contacts of the individual connectors are preferably formed in the shape of a plate such that they are suitably fitted together even in a turning movement or the like.

Likewise, as shown in FIG. 12, the contact of the third connector 24 and the contact of the fourth connector 44 are formed in the shape of a plate. Specifically, the contact of the third connector 24 is formed so as to include a plurality of plate-shaped conductive members 24a which are arranged to be aligned at predetermined intervals. Likewise, the contact of the fourth connector 44 is formed so as to include a plurality of plate-shaped conductive members 44a which are arranged to be aligned t predetermined intervals. The plate-shaped conductive members 24a of the third connector 24 are inserted and arranged between the plate-shaped conductive members 44a of the fourth connector 44, and thus the third connector 24 and the fourth connector 44 are brought into the fitted state. The contacts of the individual connectors are preferably formed in the shape of a plate such that they are suitably fitted together even in a turning movement or the like.

Here, the contacts of both the connectors which are fitted together do not need to be formed in the shape of a plate, and, for example, at least one of the first connector 23 and the second connector 33 preferably has a plate-shaped contact, and at least one of the third connector 24 and the fourth connector 44 preferably has a plate-shaped contact.

Figure 13A:
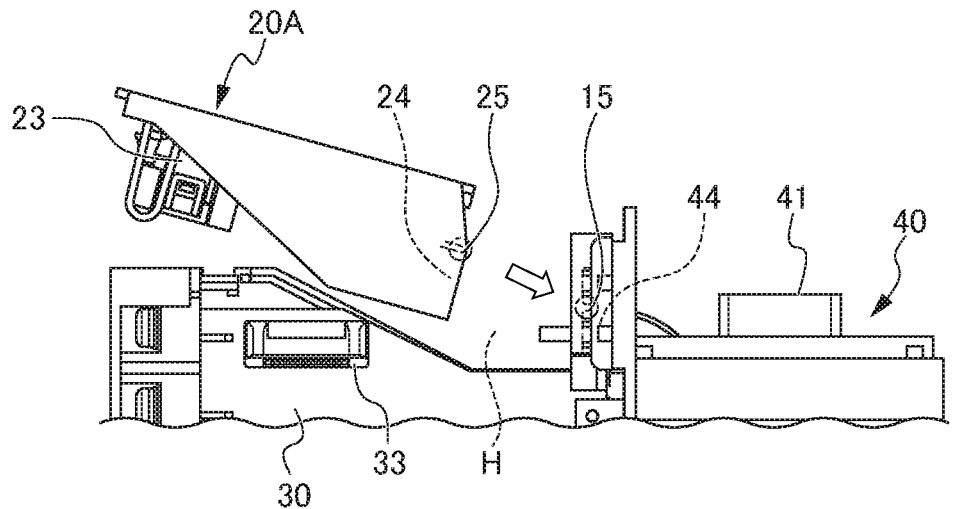
FIG. 13A is a diagram illustrating an operation of attaching a first fan unit to a housing in the second embodiment, and is a diagram illustrating an operation of moving the first fan unit obliquely downward so as to attach it to the housing.
Figure 13B:
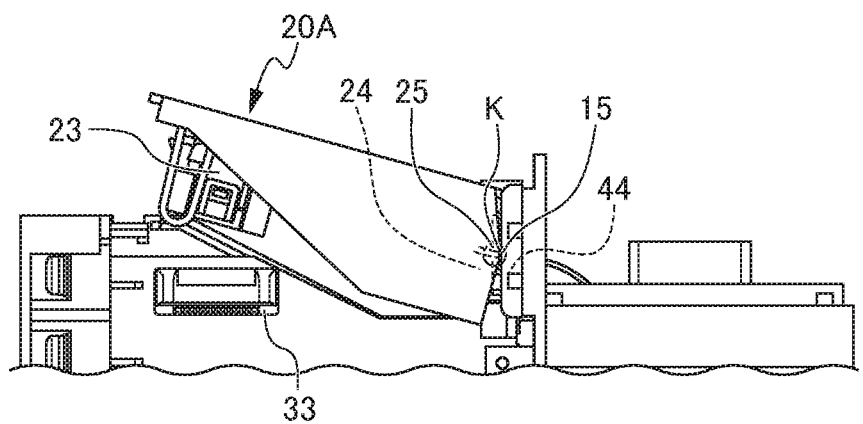
FIG. 13B is a diagram illustrating the operation of attaching the first fan unit to the housing in the second embodiment, and is a diagram illustrating a state where first turning engagement units are engaged with second turning engagement units.
Figure 13C:
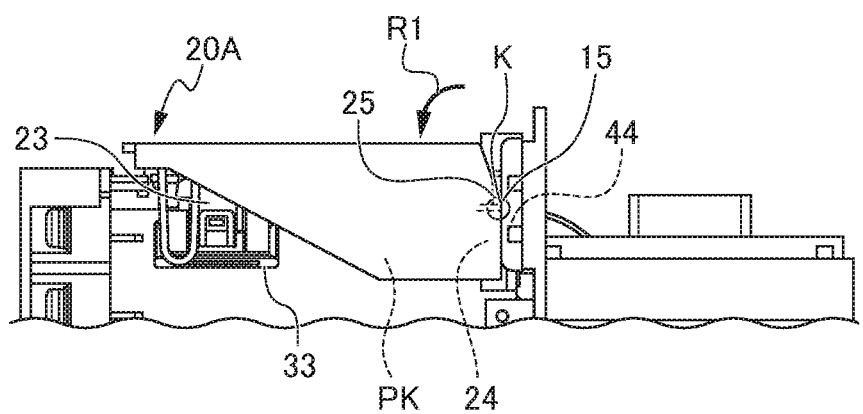
FIG. 13C is a diagram illustrating the operation of attaching the first fan unit to the housing in the second embodiment, and is a diagram illustrating a state where the first fan unit is moved to be turned about a turning axis K and is arranged in a fitting position.
Figure 14:
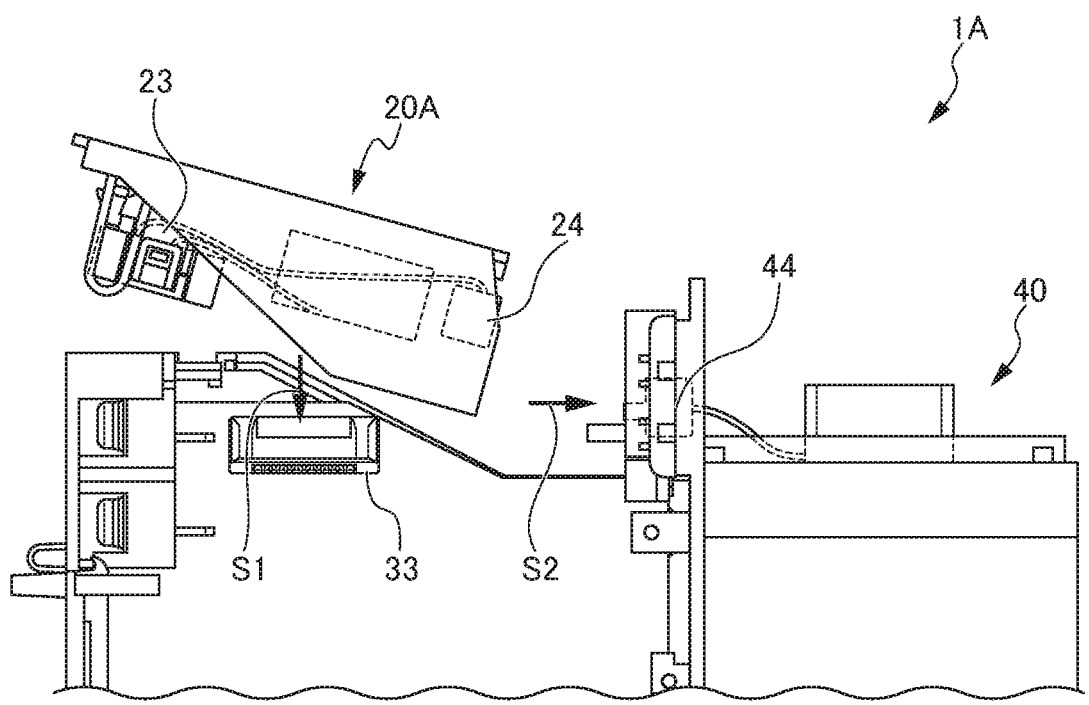
FIG. 14 is a diagram illustrating the direction of fitting of the first connector and the direction of fitting of the third connector in the second embodiment.
Figure 15:
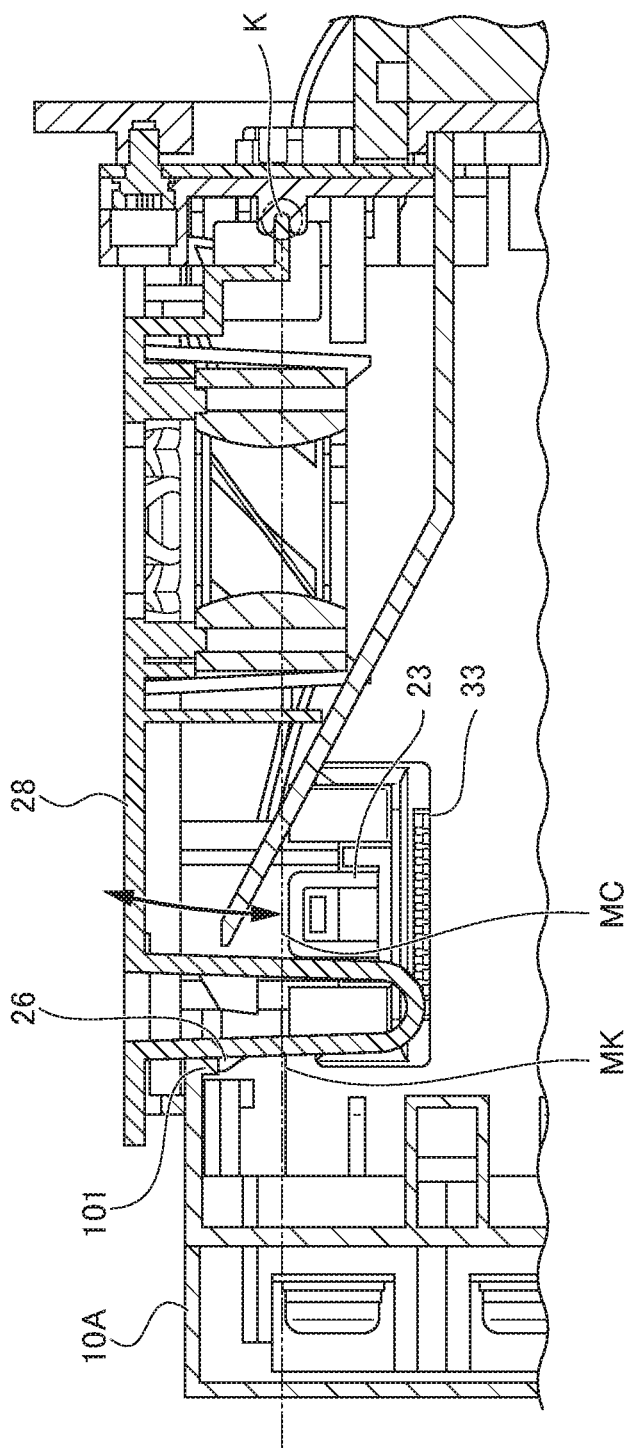
FIG. 15 is a diagram illustrating a relationship between a fitting surface in a state where the first connector and the second connector are fitted together and a turning plane which is a plane including a turning axis.

Next, an operation of attaching the first fan unit of the second embodiment to the housing will be described with reference to FIGS. 13A to 15. FIG. 13A is a diagram illustrating an operation of moving the first fan unit obliquely downward so as to attach it to the housing, FIG. 13B is a diagram illustrating a state where the first turning engagement units are engaged with the second turning engagement units and FIG. 13C is a diagram illustrating a state where the first fan unit is moved to be turned about the turning axis K and is arranged in the fitting position. FIG. 14 is a diagram illustrating the direction of fitting of the first connector and the direction of fitting of the third connector in the second embodiment. FIG. 15 is a diagram illustrating a relationship between a fitting surface in a state where the first connector and the second connector are fitted together and a turning plane which is a plane including the turning axis.

As shown in FIG. 13A, the operator first inserts the first fan unit 20A from the front side (the X1 side in the forward/backward direction X in FIG. 5) into the upper surface (the Z2 side in the vertical direction Z in FIG. 5) of the first housing 10a, and moves the first fan unit 20A to the downward side (obliquely downward side) in a direction intersecting the horizontal direction.

Then, as shown in FIG. 13B, the operator moves the first fan unit 20A so as to engage the first turning engagement units 25, 25 with (insert the first turning engagement units 25, 25 into) the second turning engagement units 15, 15. In a state where the first turning engagement units 25, 25 are engaged with (inserted into) the second turning engagement units 15, 15, the first fan unit 20A is attached to the first housing 10a such that the first fan unit 20A can be turned about the turning axis K.

Then, as shown in FIG. 13C, the operator moves and turns the first fan unit 20A in the direction of an arrow R1. Specifically, the first fan unit 20A is moved from the non-fitting position in which the first connector 23 is not fitted to the second connector 33 and in which the third connector 24 is not fitted to the fourth connector 44 to the fitting position PK in which the first connector 23 is fitted to the second connector 33 and in which the third connector 24 is fitted to the fourth connector 44. In this way, the first fan unit 20 is fitted to the housing 10.

Here, as shown in FIG. 14, in the present embodiment, a configuration is adopted in which a first fitting direction S1 that is the direction of movement of the first connector 23 when the first connector 23 is fitted to the second connector 33 and a second fitting direction S2 that is the direction of movement of the third connector 24 when the third connector 24 is fitted to the fourth connector 44 are different from each other. Hence, when the first fan unit 20A is arranged in the fitting position, the removal of the individual connectors caused such as by vibrations and the like is suppressed.

As shown in FIG. 15, a first fitting surface MC, which is the contact root surface of the first connector 23 in a state where the first connector 23 is fitted to the second connector 33, is located on a plane which is substantially the same as the turning plane MK including the turning axis K. In other words, it is preferable to adjust a position relationship such that when the first connector 23 which is moved by the turning of the first fan unit 20A about the turning axis K is fitted to the second connector 33, the individual connectors are linearly fitted substantially in the vertical direction without being displaced laterally. In this way, the inclination and the displacement of the individual connectors caused by the turning movement at the time of fitting is suppressed.

Here, likewise, in a position relationship between the third connector 24 and the fourth connector 44, for example, a second fitting surface, which is the contact root surface of the third connector 24 in a state where the third connector 24 is fitted to the fourth connector 44, is preferably located on a plane which is substantially the same as a turning plane (a plane separate from the turning plane MK described above, a turning plane including the root portion of the third connector 24 in a state where the third connector 24 and the fourth connector 44 are fitted together and the turning axis K) including the turning axis K.

Figure 16A:
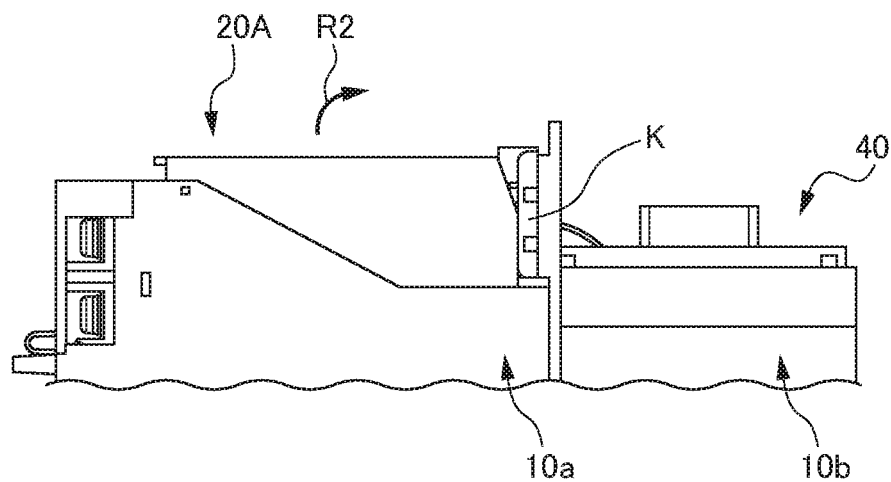
FIG. 16A is a diagram illustrating an operation of removing the first fan unit and the second fan unit from the housing in the second embodiment, and is a diagram illustrating an operation of moving and turning the first fan unit so as to move it from the fitting position to a non-fitting position.

Next, an operation of removing the first fan unit and the second fan unit in the second embodiment from the housing will be described with reference to FIGS. 16A to 16D. FIG. 16A is a diagram illustrating an operation of moving and turning the first fan unit so as to move it from the fitting position to the non-fitting position, FIG. 16B is a diagram illustrating an operation of moving the first fan unit obliquely upward so as to remove it from the housing, FIG. 16C is a diagram illustrating an operation of moving the second fan unit to the side of the storage region in which the first fan unit is stored and FIG. 16D is a diagram illustrating an operation of making the second fan unit pass through the storage region so as to remove it from the housing.

As shown in FIG. 16A, the operator first moves and turns the first fan unit 20A about the turning axis K in the direction of an arrow R2 so as to move it from the fitting position PK to the non-fitting position.

Figure 16B:
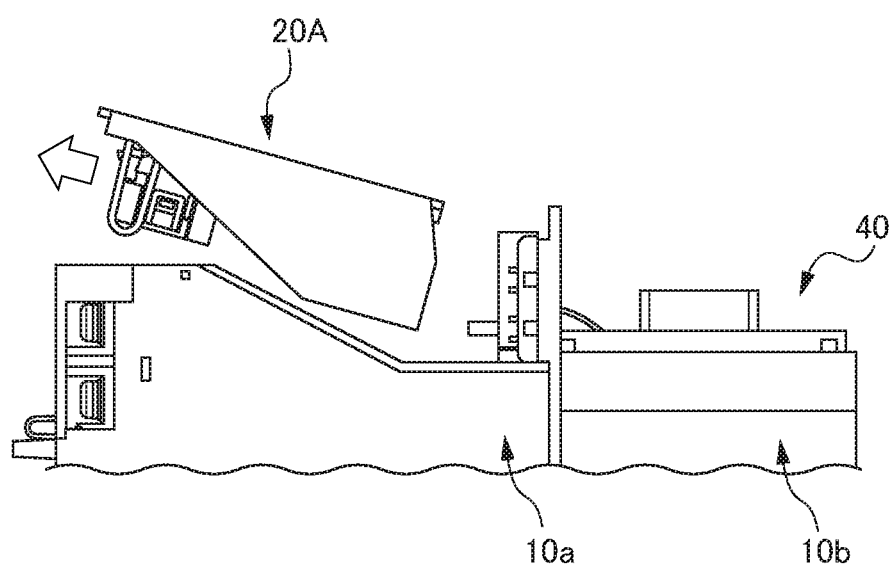
FIG. 16B is a diagram illustrating the operation of removing the first fan unit and the second fan unit from the housing in the second embodiment, and is a diagram illustrating an operation of moving the first fan unit obliquely upward so as to remove it from the housing.

Then, as shown in FIG. 16B, the operator moves the first fan unit obliquely upward so as to release the engaged state of the first turning engagement units 25, 25 and the second turning engagement units 15, 15, and thereby removes the first fan unit from the first housing 10a.

Figure 16C:
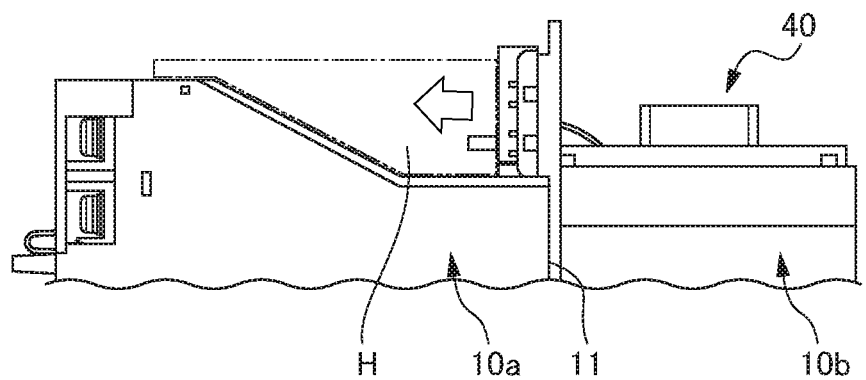
FIG. 16C is a diagram illustrating the operation of removing the first fan unit and the second fan unit from the housing in the second embodiment, and is a diagram illustrating an operation of moving the second fan unit to the side of a storage region in which the first fan unit is stored.
Figure 16D:
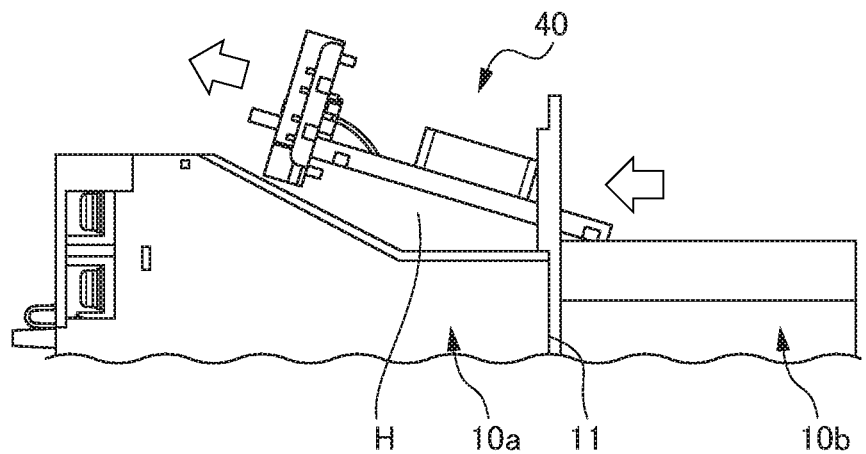
FIG. 16D is a diagram illustrating the operation of removing the first fan unit and the second fan unit from the housing in the second embodiment, and is a diagram illustrating an operation of making the second fan unit pass through the storage region so as to remove it from the housing.

Then, as shown in FIG. 16C, the operator inserts a hand or a tool into the storage region H which is a region where the first fan unit 20A is stored so as to release a fixed member which is not shown, and thereby moves the second fan unit 40 to the side of the storage region H.

Then, as shown in FIG. 16D, the operator makes the second fan unit 40 pass through the storage region H so as to remove the second fan unit 40 from the second housing 10b. As described above, the first housing 10a (the housing 10A) includes the storage region H that stores the first fan unit 20A arranged in the fitting position and that forms part of a movement path through which the second fan unit 40 is fitted and removed in a state where the first fan unit 20A is removed. In the present embodiment, in the motor drive device 1A, not only the first fan unit 20A but also the second fan unit 10 arranged on the backward side in the forward/backward direction X can be removed from the housing 10 by being pulled obliquely upward.

In the present embodiment, the storage region H where the first fan unit 20A is removed is utilized not only as the movement path through which the second fan unit 40 is removed but also as an operation region for the removal operation. In this way, the motor drive device 1A does not need a maintenance space for the second fan unit 40, so as to have excellent maintainability.

The more detailed structure of the motor drive device 1A in the second embodiment will next be described in detail with reference to FIGS. 17 to 23B.

Figure 17:
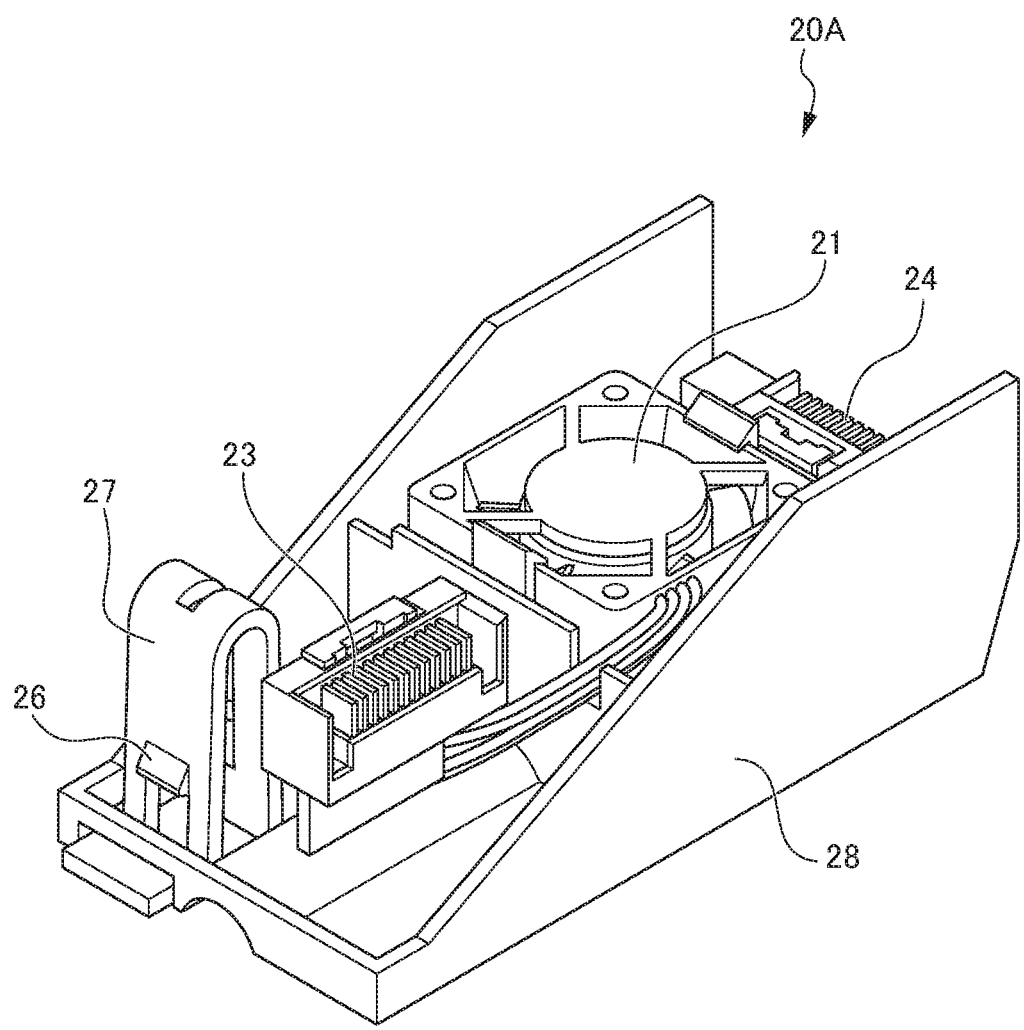
FIG. 17 is a diagram showing the fitting portion of a first fan cover in the second embodiment.

FIG. 17 is a diagram showing the fitting portion 26 of the first fan cover 28 in the second embodiment. As shown in FIG. 17, the first fan cover 28 includes the fitting portion 26 which is fitted to the housing 10A. The fitting portion 26 is arranged on the side of the front surface of the motor drive device 1A. More specifically, the fitting portion 26 is arranged on the front side of the first fan cover 28 and is provided on the front surface of a U-shaped portion 27 which can be elastically deformed in the forward/backward direction and which is formed in the shape of the letter U. In a state where the first fan cover 26 is attached to the housing 10A, the fitting portion 26 is a fitting claw which protrudes forward as the front surface of the U-shaped portion 27 extends upward.

In this way, as also shown in FIG. 15 described above, when the first fan cover 28 is rotated with respect to the housing 10A, the fitting portion 26 of the first fan cover 28 is fitted to a protruding portion 101 of the housing 10A, and thus the first fan cover 28 is fixed to the housing 10A. Here, the fitting portion 26 is arranged on the side of the front surface of the motor drive device 1A, and thus the fitting and removal of fan unit by fitting can be performed on the side of the front surface of the motor drive device 1A. In other words, since the first fan unit can be fitted and removed by operating the fitting portion 26 on the front side, and thus, it is not required for the operator to plunge the hand deeply, and thus even when the maintenance space in the upper side of the motor drive device 1A is narrow, the accessibility of fitting and removal of the fan unit is satisfactory. In addition, on the front surface of the U-shaped portion 27 which can be elastically deformed in the forward/backward direction and which is formed in the shape of the letter U, the fitting portion 26 is provided, and thus the fitting portion 26 can be elastically deformed in the forward/backward direction, with the result that the accessibility of fitting and removal of the fan unit is more satisfactory.

Figure 18A:
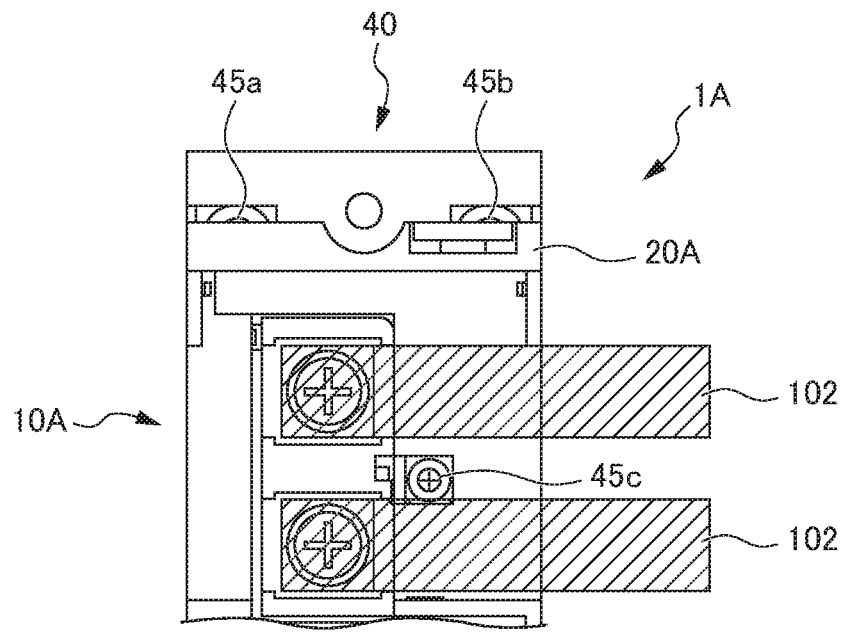
FIG. 18A is a diagram showing the fixing portions of the second fan unit in the second embodiment, and is a diagram showing a state where the first fan unit is attached.
Figure 18B:
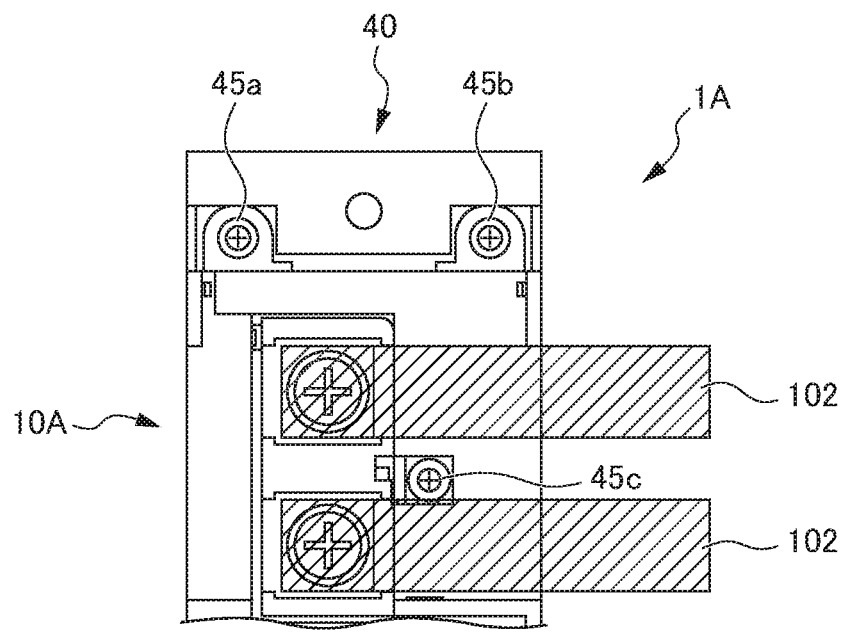
FIG. 18B is a diagram showing the fixing portions of the second fan unit in the second embodiment, and is a diagram showing a state where the first fan unit is removed.

FIG. 18A is a diagram showing the fixing portions 45a, 45b and 45c of the second fan unit 40 in the second embodiment, and is a diagram showing a state where the first fan unit 20A is attached. FIG. 18B is a diagram showing the fixing portions 45a, 45b and 45c of the second fan unit 40 in the second embodiment, and is a diagram showing a state where the first fan unit 20A is removed. As shown in FIGS. 18A and 18B, with the second fan unit 40, in a state where the first fan unit 20A is removed from the housing 10A, it is possible to access the fixing portions 45a, 45b and 45c for fixing the second fan unit 40 to the housing 10A from the front surface of the motor drive device 1A and to release the fixing with the fixing portions 45a, 45b and 45c.

As shown in FIG. 18A, in a state where the first fan unit 20A is attached, the fixing portions 45a and 45b arranged in an upper portion are located so as to be hidden by the first fan unit 20A when seen from the front side. By contrast, as shown in FIG. 18B, in a state where the first fan unit 20A is removed, the fixing portions 45a and 45b are exposed such that they can easily be accessed from the front side. On the other hand, the fixing portion 45c arranged in a lower portion can be accessed from between a plurality of short bars 102 without being hidden by the first fan unit 20A.

For example, as in an example shown in FIGS. 18A and 18B, the fixing portions 45a, 45b and 45c may be fixed with screws, or with latches or the like. In the case of the screw fixing, when the first fan unit 20A is removed, for the two fixing portions 45a and 45b in the upper portion, the screws can be removed by inserting a screwdriver from the front side. Likewise, for the fixing portion 45c arranged in the lower portion, the screw can be removed by inserting a screwdriver from the front side into between the short bars 102.

In this way, the fixing portions 45a, 45b and 45c can be arranged even in a part which is hidden by the first fan unit 20A, and this thus contributes to a reduction in the size of the motor drive device 1A. In particular, the fixing portions 45a, 45b and 45c are arranged in the positions which can be accessed from the front surface of the motor drive device 1A, and thus the accessibility is very satisfactory. The fixing portions 45a, 45b and 45c of the second fan unit 40 can be accessed without removal of removable parts such as the short bars 102 for connecting the adjacent terminals of the motor drive device 1A, and thus the accessibility is further enhanced.

Figure 19A:
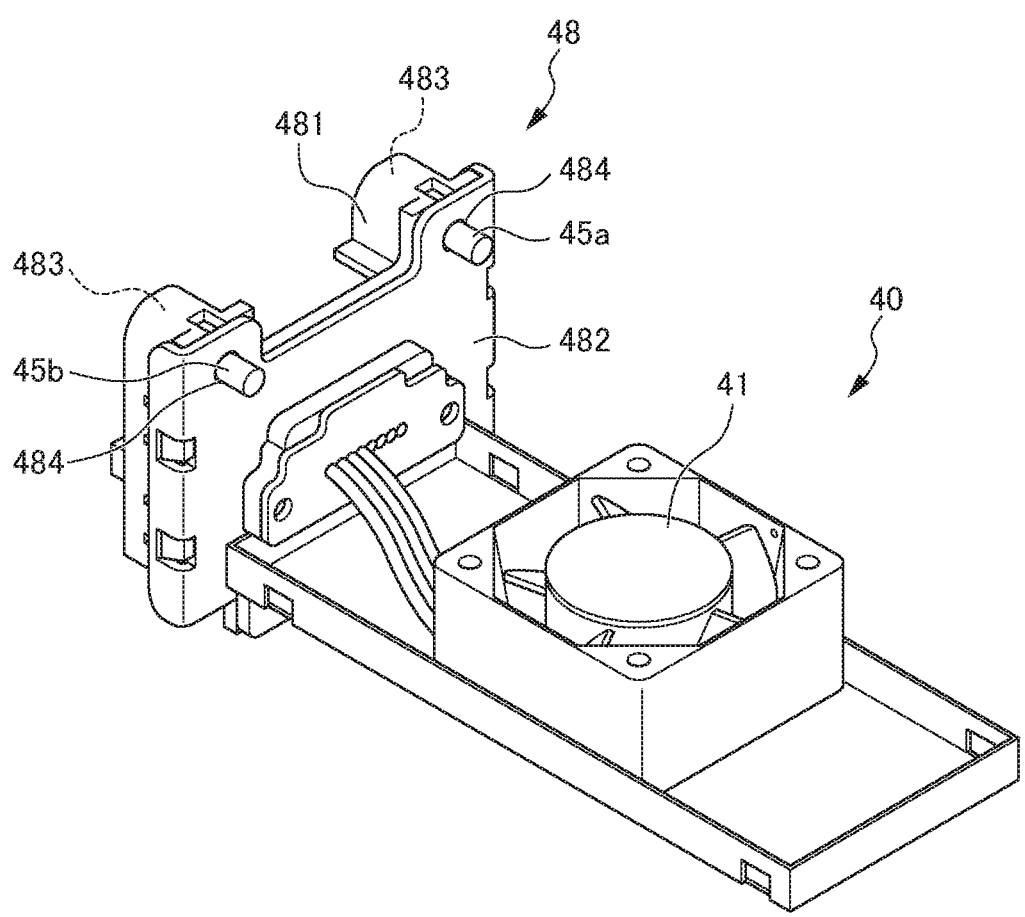
FIG. 19A is a diagram showing the fixing portions of the second fan unit in the second embodiment, and is a diagram showing a state where a second fan cover is attached.
Figure 19B:
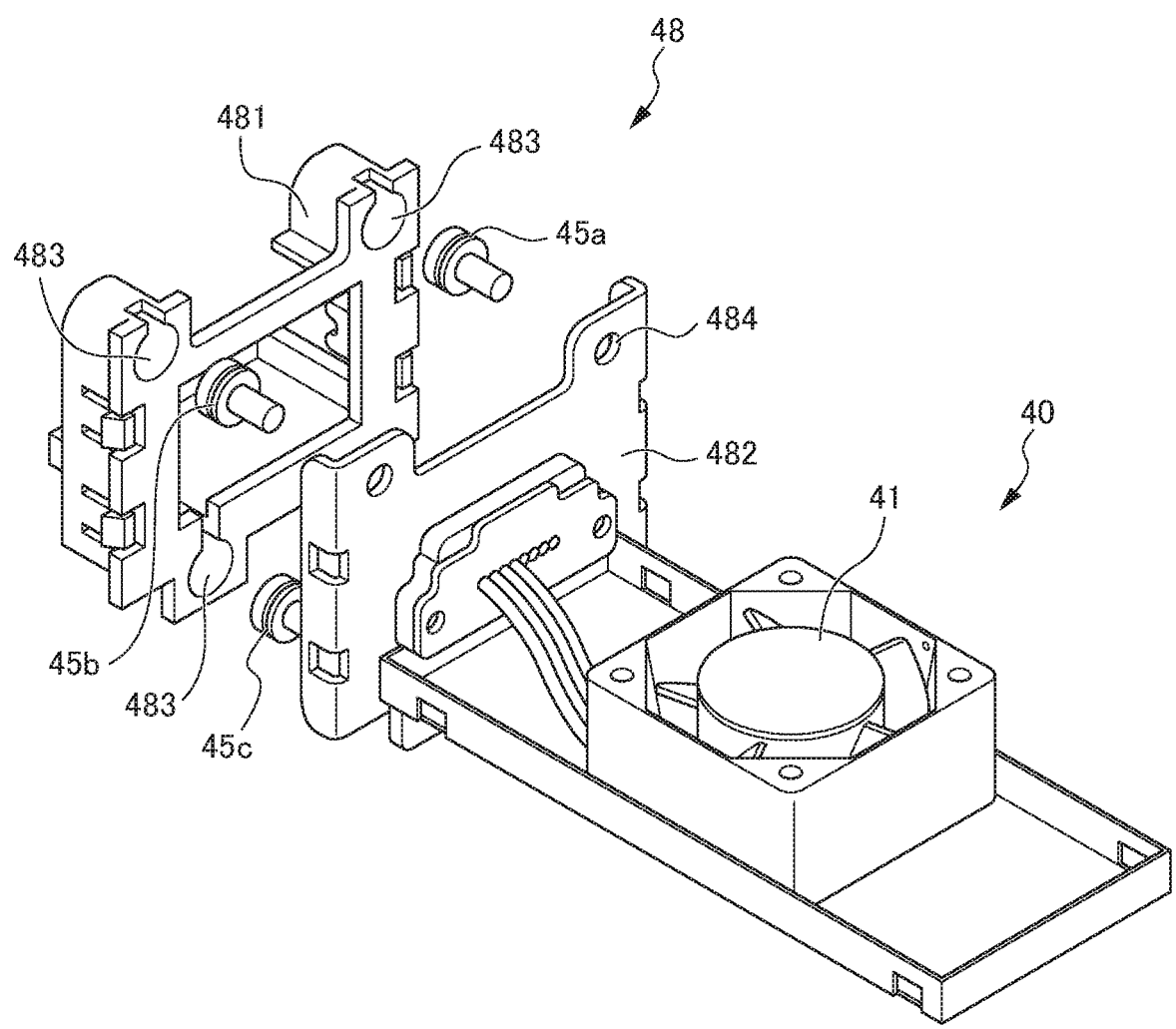
FIG. 19B is a diagram showing the fixing portions of the second fan unit in the second embodiment, and is a diagram showing a state where the second fan cover is removed.

FIG. 19A is a diagram showing the fixing portions 45a, 45b and 45c of the second fan unit 40 in the second embodiment and is a diagram showing a state where a second fan cover 48 is attached FIG. 19B is a diagram showing the fixing portions 45a, 45b and 45c of the second fan unit 40 in the second embodiment and is a diagram showing a state where a second fan cover 48 is removed.

Figure 20A:
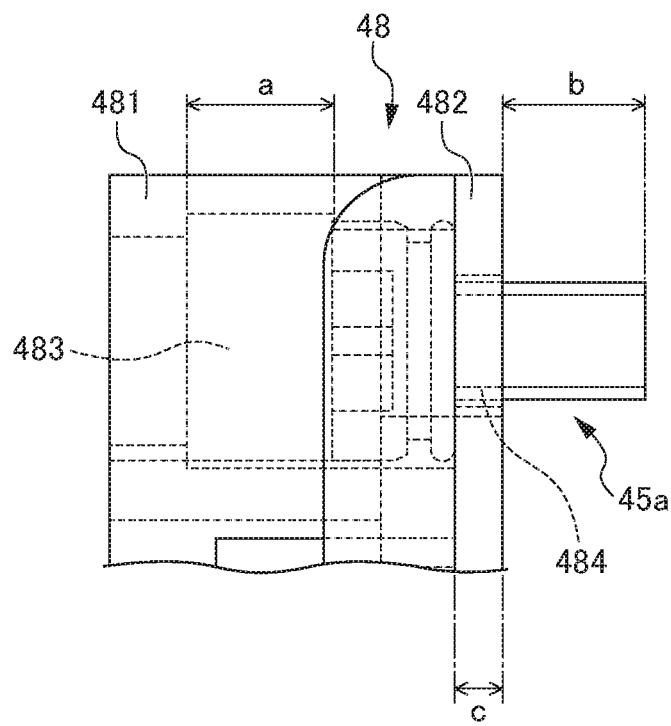
FIG. 20A is a side view showing the fixing portions of the second fan unit in the second embodiment, and is a diagram showing a state where screws are tightened.
Figure 20B:
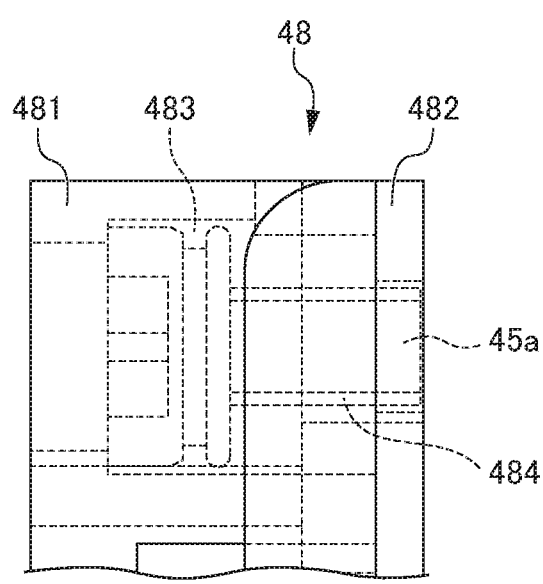
FIG. 20B is a side view showing the fixing portions of the second fan unit, in the second embodiment, and is a diagram showing a state where the screws are loosened.

FIG. 20A is a side view showing the fixing portions 45a, 45b and 45c of the second fan unit in the second embodiment, and is a diagram showing a state where the screws are tightened. FIG. 20B is a side view showing the fixing portions 45a, 45b and 45c of the second fan unit 40 in the second embodiment, and is a diagram showing a state where the screws are loosened.

As shown in FIGS. 19A and 19B, the second fan unit 40 includes the second fan cover 48 in its front portion, and the fixing portions 45a, 45b and 45c are partially covered by the second fan cover 48. Specifically, the second fan cover 48 is formed with a front side second fan cover 481 and a back side second fan cover 482, where concave portions 483, 483, 483 for covering the screws of the fixing portions 45a, 45b and 45c are formed in the former from the back side and through holes 484, 484, 484 through which the leg portions of the screws are inserted are formed in the latter. The front side second fan cover 481 and the back side second fan cover 482 are overlaid on each other, and thus the fixing portions 45a, 45b and 45c are covered.

Here, the depth of the recesses of the concave portions 483, 483, 483 in the front side second fan cover 481 is set such that the screws of the fixing portions 45a, 45b and 45c are prevented from being disconnected from the concave portions 483, 483, 483 and are prevented from being excessively extended out. More specifically, as shown in FIGS. 20A and 20B, in a state where the front side second fan cover 481 and the back side second fan cover 482 are overlaid on each other, a distance a from the upper surface of the head portions of the screws of the fixing portions 45a, 45b and 45c to the bottom surface of the concave portions 483 (that is, the movable distance of the screws in the forward/backward direction in the concave portions 483) and a distance b from the back end surface of the back side second fan cover 482 to the tip end surface of the leg portions of the screws (that is, the length of the leg portions of the screws which can be protruded from the back end surface of the back side second fan cover 482) are set substantially equal to each other.

In this way, the fixing portions 45a, 45b and 45c which fix the second fan unit 40 to the housing 10A are partially covered by the second fan cover 48, and thus it is possible to prevent the screws and the like of the fixing portions 45a, 45b and 45c from being dropped, with the result that the accessibility when the fixing portions 45a, 45b and 45c are fitted and removed is satisfactory.

Figure 21A:
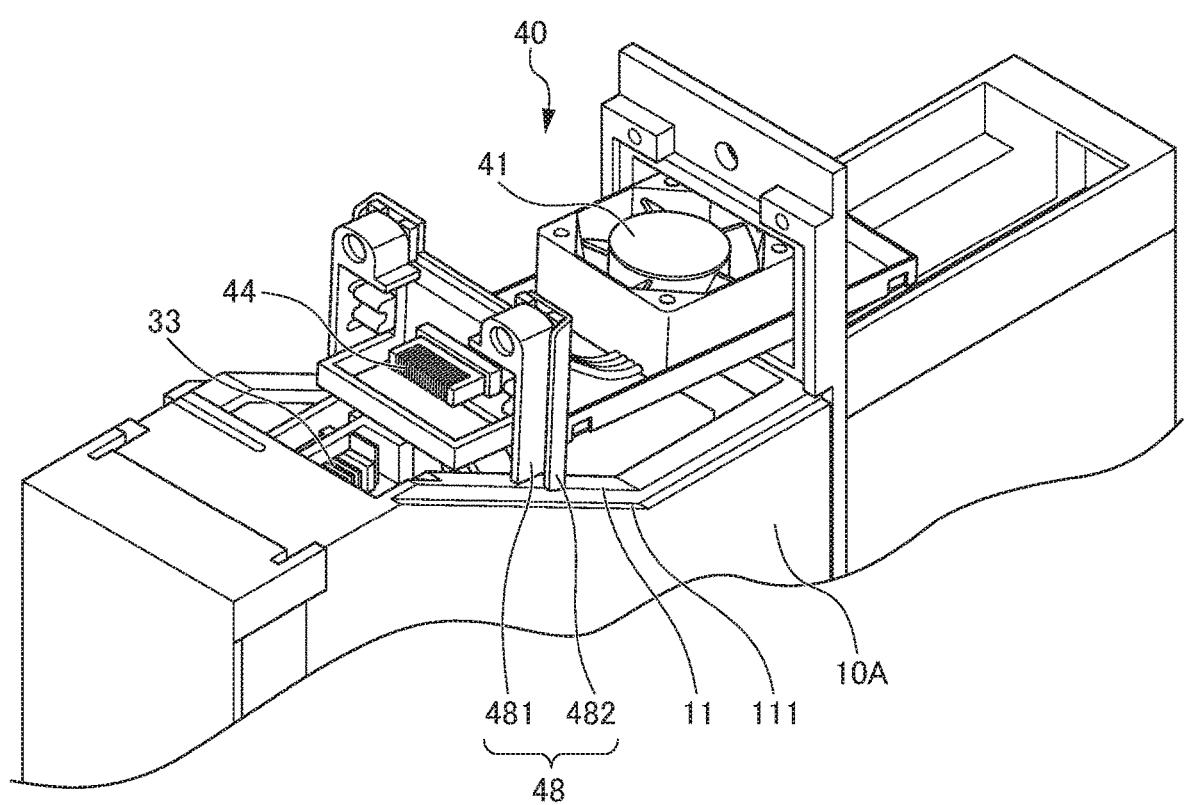
FIG. 21A is a diagram showing the inclined surface portion of the housing in the second embodiment, and is a diagram showing a state where the second fan unit is fitted and removed with respect to the housing.
Figure 21B:
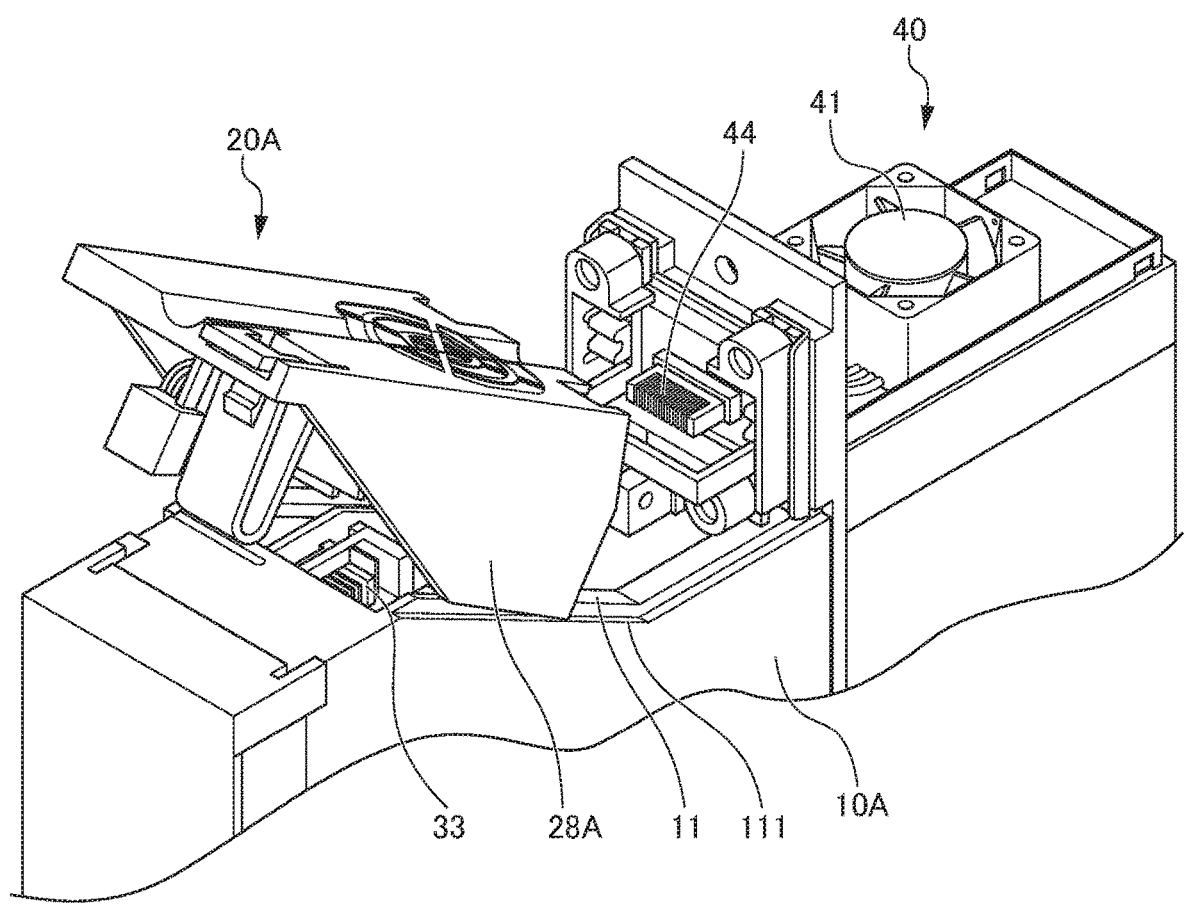
FIG. 21B is a diagram showing the inclined surface portion of the housing in the second embodiment, and is a diagram showing a state where the first fan unit is fitted and removed with respect to the housing.

FIG. 21A is a diagram showing the inclined surface portion 11 of the housing 10A in the second embodiment, and is a diagram showing a state where the second fan unit 40 is fitted and removed with respect to the housing 10A. FIG. 21B is a diagram showing the inclined surface portion 11 of the housing 10A in the second embodiment, and is a diagram showing a state where the first fan unit 20A is fitted and removed with respect to the housing 10A. As shown in FIGS. 21A and 21B, the housing 10A includes, in the upper surface, the inclined surface portion 11 which guides the first fan unit 20A and the second fan unit 40 from obliquely forward of the housing 10A toward backward.

As shown in FIG. 21A, when the second fan unit 40 is fitted and removed with respect to the housing 10A, the bottom surfaces of the front side second fan cover 481 and the back side second fan cover 482 of the second fan cover 48 slide on the inclined surface portion 11 provided in the upper surface of the housing 10A. In this way, the second fan unit 40 is smoothly guided to a predetermined attachment position, and thus the second fan unit 40 can be smoothly fitted and removed.

Likewise, as shown in FIG. 21B, when the first fan unit 20A is fitted and removed with respect to the housing 10A, the bottom surface of a first fan cover 28A slides on the inclined surface portion 11 provided in the upper surface of the housing 10A. In this way, the first fan unit 20A is smoothly guided to a predetermined attachment position, and thus the first fan unit 20A can be smoothly fitted and removed. In particular, as shown in FIGS. 21A and 21B, in the case of a mechanism such as a rail in which a step 111 is provided on the outside of the inclined surface portion 11 along the inclined surface portion 11, the inner surface of the first fan cover 28A and the step ill in the housing 10A are located, and thus a displacement in a left/right direction is suppressed.

In this way, when the first fan unit 20A and the second fan unit 40 are fitted and removed with respect to the housing 10A, the guide mechanism such as a rail is present, and thus the individual fan units can be smoothly fitted and removed with respect to the housing 10A, with the result that the accessibility of the fitting and removal of the fan units is enhanced. It is also possible to prevent the damage of the connector and the like caused such as by the displacement of the fitting position of the connector. Furthermore, the guide mechanism is shared for the first fan unit 20A and the second fan unit 40, and thus it is possible to reduce the addition of an extra structure.

Figure 22:
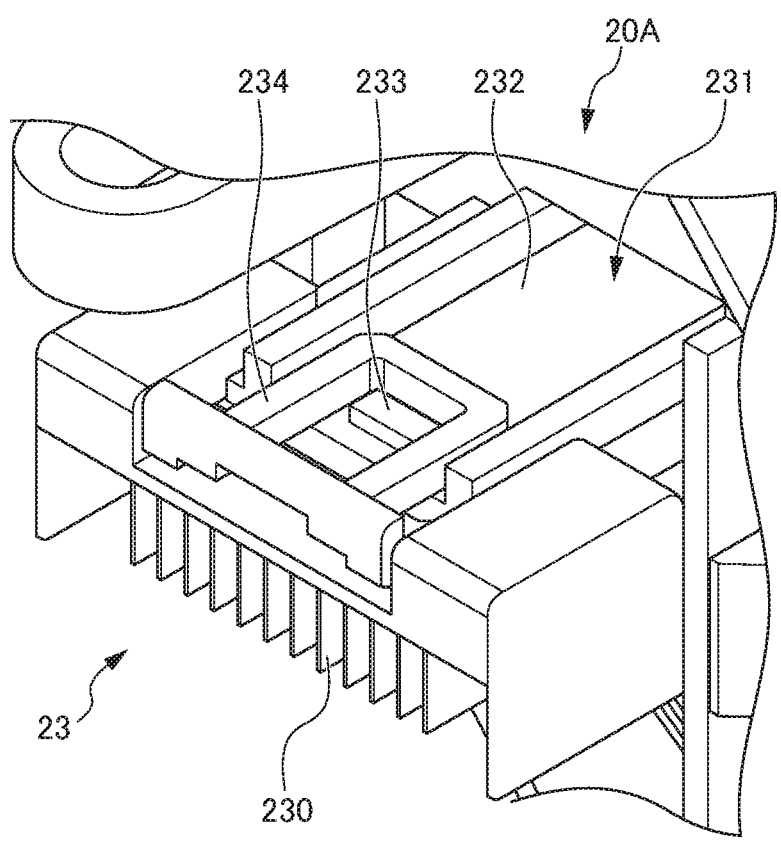
FIG. 22 is a diagram showing the connector holding unit of the first connector in the second embodiment.
Figure 23A:
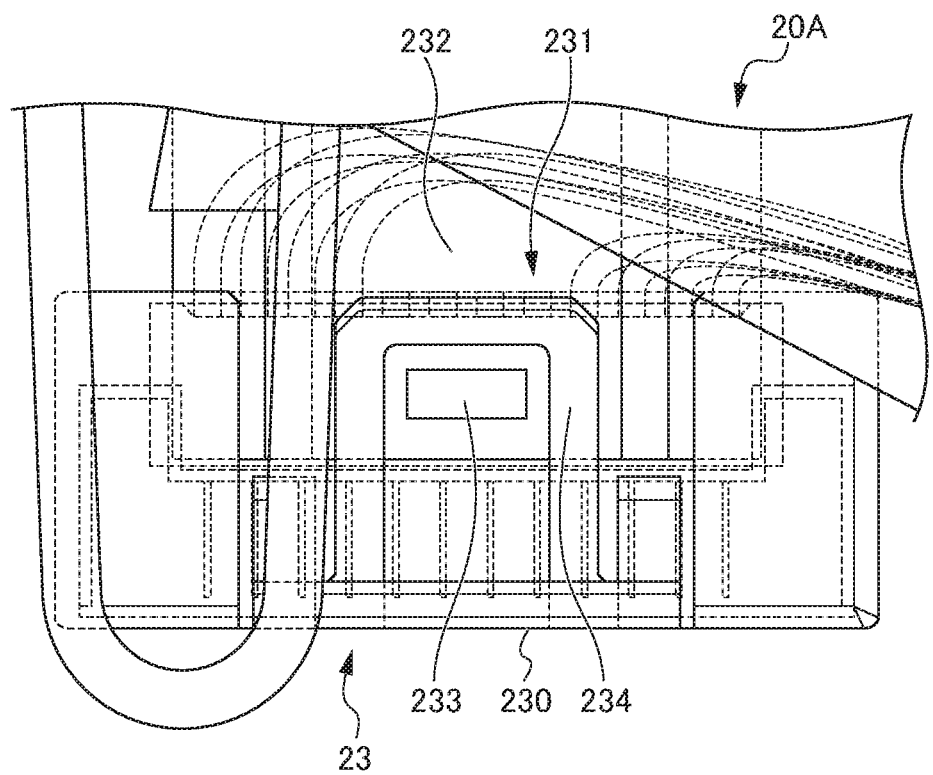
FIG. 23A is a diagram showing a state where in the first connector of the second embodiment, a connector main body is arranged in the center of the connector holding unit.
Figure 23B:
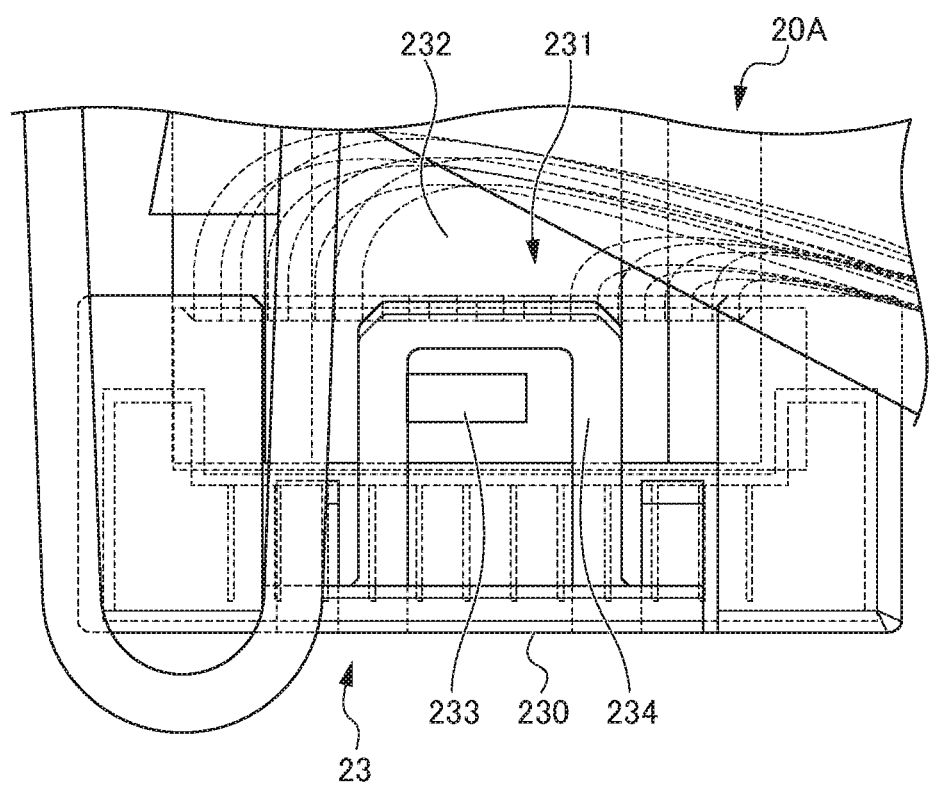
FIG. 23B is a diagram showing a state where in the first connector of the second embodiment, the connector main body is arranged on one side of the connector holding unit in a longitudinal direction.

FIG. 22 is a diagram showing the connector holding unit 231 of the first connector 23 in the second embodiment. FIG. 23A is a diagram showing a state where in the first connector 23 of the second embodiment, a connector main body 230 is arranged in the center of the connector holding unit 231. FIG. 23B is a diagram showing a state where in the first connector 23 of the second embodiment, the connector main body 230 is arranged on one side of the connector holding unit 231 in the longitudinal direction. As shown in FIGS. 22 to 23B, the first connector 23 includes the connector holding unit 231 which movably holds the connector in order to absorb a backlash. Likewise, the connector holding unit 231 can be applied to the second connector 33, the third connector 24 and the fourth connector 44.

The connector holding unit 231 includes: a fixed portion 232 which is fixed to the first fan unit 20A and which includes a convex portion 233; and an engagement portion 234 which supports the connector main body 230, which can engage with the convex portion 233 with a clearance in the forward/backward direction and in the left/right direction and which is formed in the shape of the letter C.

As shown in FIG. 23A, in a state where the connector main body 230 is arranged in the center of the connector holding unit 231, the connector main body 230 has a backlash in the forward/backward direction and in the left/right direction, and can be displaced in the forward/backward direction and in the left/right direction so as to be moved. In other words, as shown in FIG. 23B, the connector main body 230 can be moved to, for example, one side in the longitudinal direction (one side in the left/right direction) from the connector holding unit 231.

Here, in a state where both the connectors which are fitted to each other are completely fixed, when only a slight displacement is generated, it is difficult to achieve the fitting. Hence, the connector holding unit 231 is made to have a backlash, and thus a displacement of the connector is absorbed by the backlash of the connector holding unit 231, with the result that flexible insertion can be achieved in guiding. Since in particular, in the rotation fitting of the present embodiment, it is impossible to avoid a displacement of the connector, a large backlash is provided in the connector holding unit 231, and thus more smooth fitting can be achieved.

Hence, at least one of the first connector 23 and the second connector 33 which are fitted to each other preferably includes the connector holding unit which movably holds the connector in order to absorb a backlash. Likewise, at least one of the third connector 24 and the fourth connector 44 which are fitted to each other preferably includes the connector holding unit which movably holds the connector in order to absorb a backlash.

In the present embodiment having the configuration described above, in addition to the effects of the embodiments described above, the following effects are achieved.

In the present embodiment, in the motor drive device, the housing includes the second turning engagement units which are engaged with the first turning engagement units, which are engaged with the first turning engagement units and are disengaged therefrom by the movement of the first fan unit in a direction (oblique direction) intersecting the horizontal direction and which pivotally support the turning movement of the first fan unit in the engaged state where the second turning engagement units are engaged with the first turning engagement units. Then, in the engaged state, the first fan unit is engaged with the housing such that the first fan unit can be moved to be turned about the predetermined turning axis both to the non-fitting position in which the first connector is not fitted to the second connector and in which the third connector is not fitted to the fourth connector and to the fitting position in which the first connector is fitted to the second connector and in which the third connector is fitted to the fourth connector.

In this way, the motor drive device is formed such that the first fan unit can be removed from the housing by being pulled obliquely upward. In this way, in the motor drive device, a maintenance space required in the upper side thereof in the vertical direction can be reduced in size. In this way, the motor drive device is excellent in the maintainability of the fan motor. The motor drive device is formed such that the first fan unit can be removed from the housing by being pulled obliquely upward, and thus parts and the like can be mounted on the front side (the X1 side in the forward/backward direction X in FIG. 5) of the first fan unit.

In the present embodiment, a configuration is adopted in which the first fitting direction S1 that is the direction of movement of the first connector 23 when the first connector 23 is fitted to the second connector 33 and the second fitting direction S2 that is the direction of movement of the third connector 24 when the third connector 24 is fitted to the fourth connector 44 are different from each other. In this way, when the first fan unit is arranged in the fitting position, the removal of the individual connectors caused such as by vibrations and the like is suppressed.

In the present embodiment, the first fitting surface MC, which is the contact root surface of the first connector 23 in a state where the first connector 23 is fitted to the second connector 33, is located on a plane which is substantially the same as the turning plane MK including the turning axis K. In other words, a position relationship between the first connector 23 and the second connector 33 is adjusted such that when the first connector 23 which is moved by the turning of the first fan unit 20A about the turning axis K is fitted to the second connector 33, the plate-shaped conductive members 23a and the plate-shaped conductive members 33a in the contacts thereof are parallel to each other. In other words, the first connector 23 and the second connector 33 are arranged such that the plate-shaped conductive members 23a and the plate-shaped conductive members 33a of the contacts are substantially parallel to a tangent to the turning movement in the fitting position. In this way, the inclination and the displacement of the individual connectors caused by the turning movement at the time of fitting is suppressed.

In the present embodiment, the first housing 10a (the housing 10) includes the storage region H that stores the first fan unit 20A arranged in the fitting position and that forms part of the movement path through which the second fan unit 40 is fitted and removed in a state where the first fan unit 20A is removed.

In this way, in the motor drive device 1A, not only the first fan unit 20A but also the second fan unit 40 arranged on the backward side in the forward/backward direction X can be removed from the housing 10 by being pulled obliquely upward. In this way, in the motor drive device, the maintenance space required in the upper side thereof in the vertical direction can be reduced in size. In this way, the motor drive device is excellent in the maintainability of the fan motor.

The motor drive device is formed such that the first fan unit and the second fan unit can be removed from the housing by being pulled obliquely upward, and thus parts and the like can be mounted on the front side (the X1 side in the forward/backward direction X in FIG. 5) of the first fan unit and the second fan unit.

In the present embodiment, the storage region H where the first fan unit 20A is removed is utilized not only as the movement path through which the second fan unit 40 is removed but also as the operation region for the removal operation. In this way, the motor drive device 1A does not need a maintenance space for the second fan unit 40, so as to have excellent maintainability.

Third Embodiment

Figure 24:
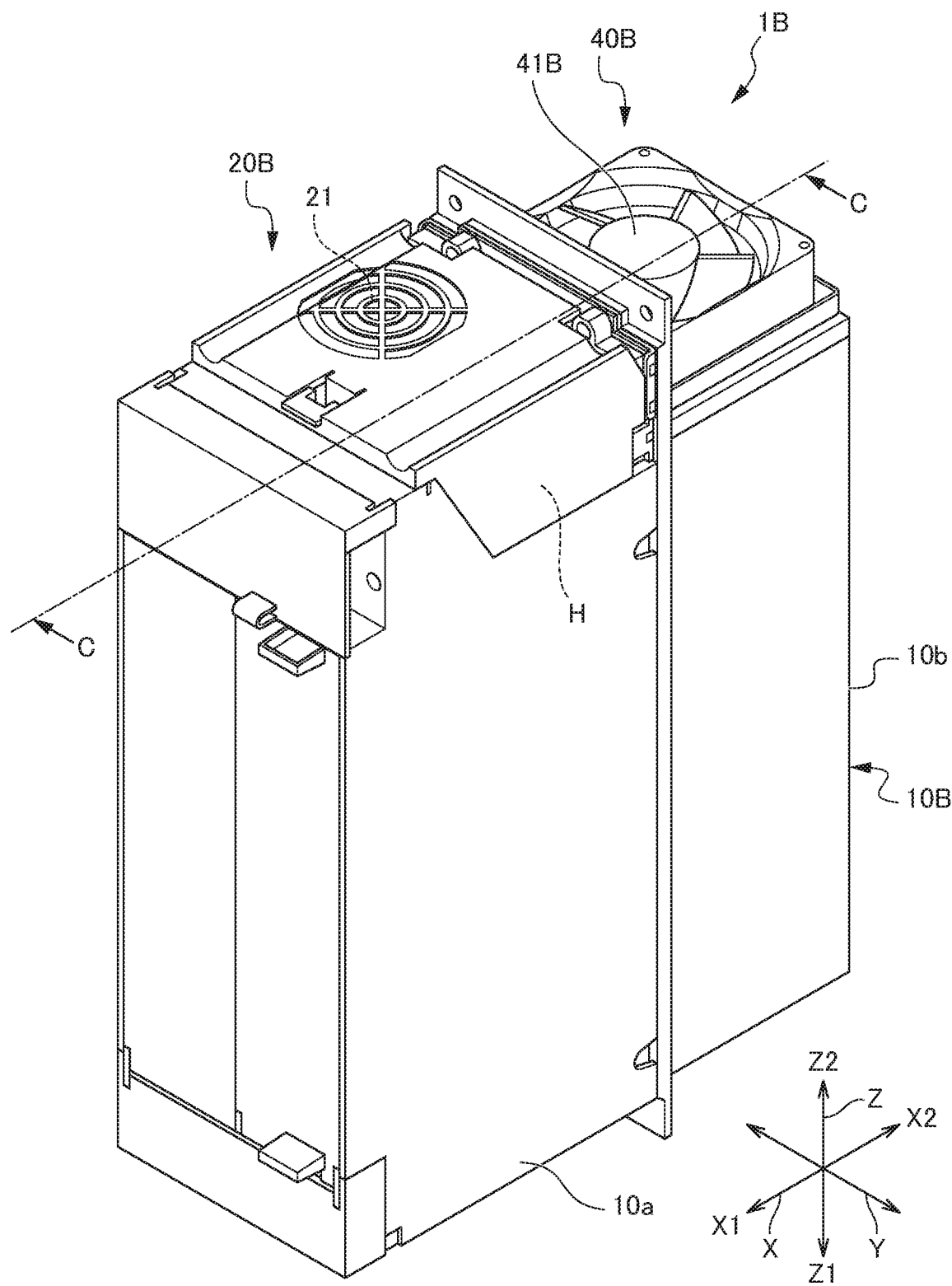
FIG. 24 is a perspective view of a motor drive device in a third embodiment.
Figure 25:
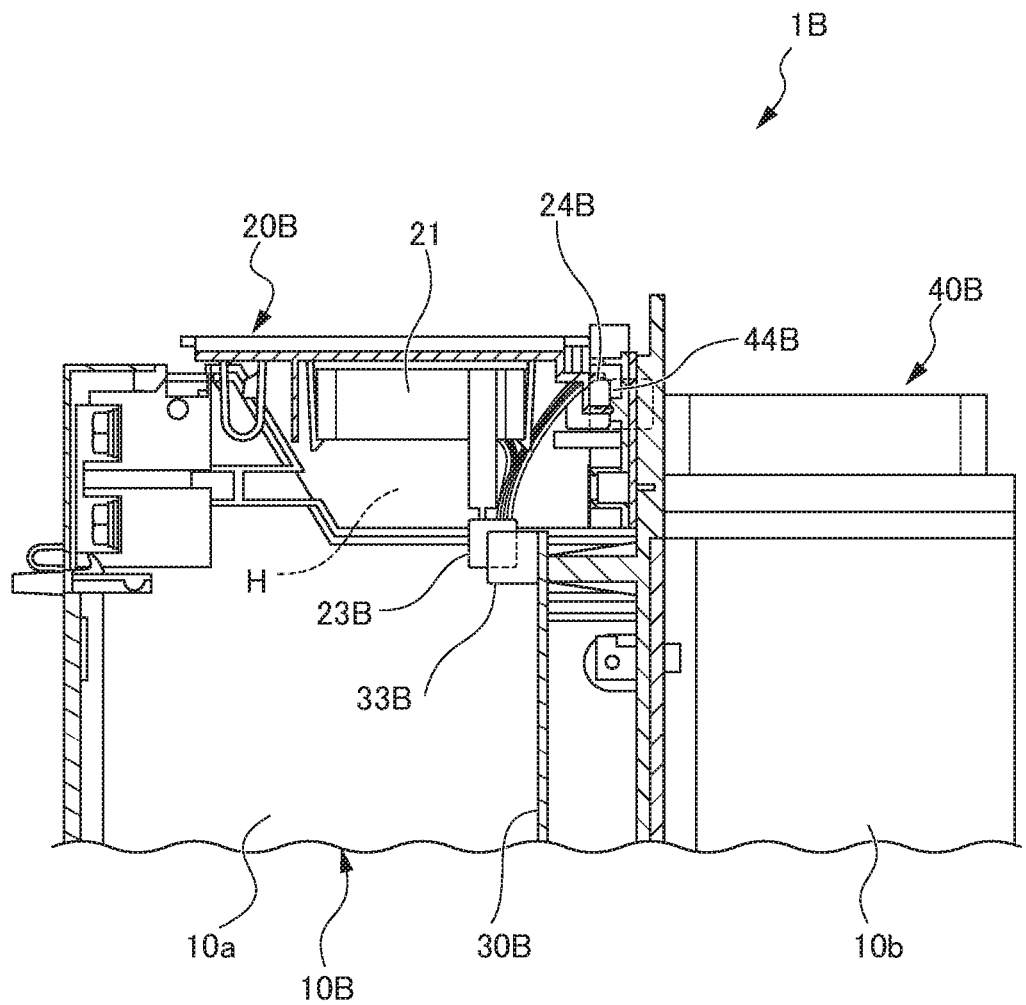
FIG. 25 is a cross-sectional view taken along line C-C in FIG. 24.
Figure 26:
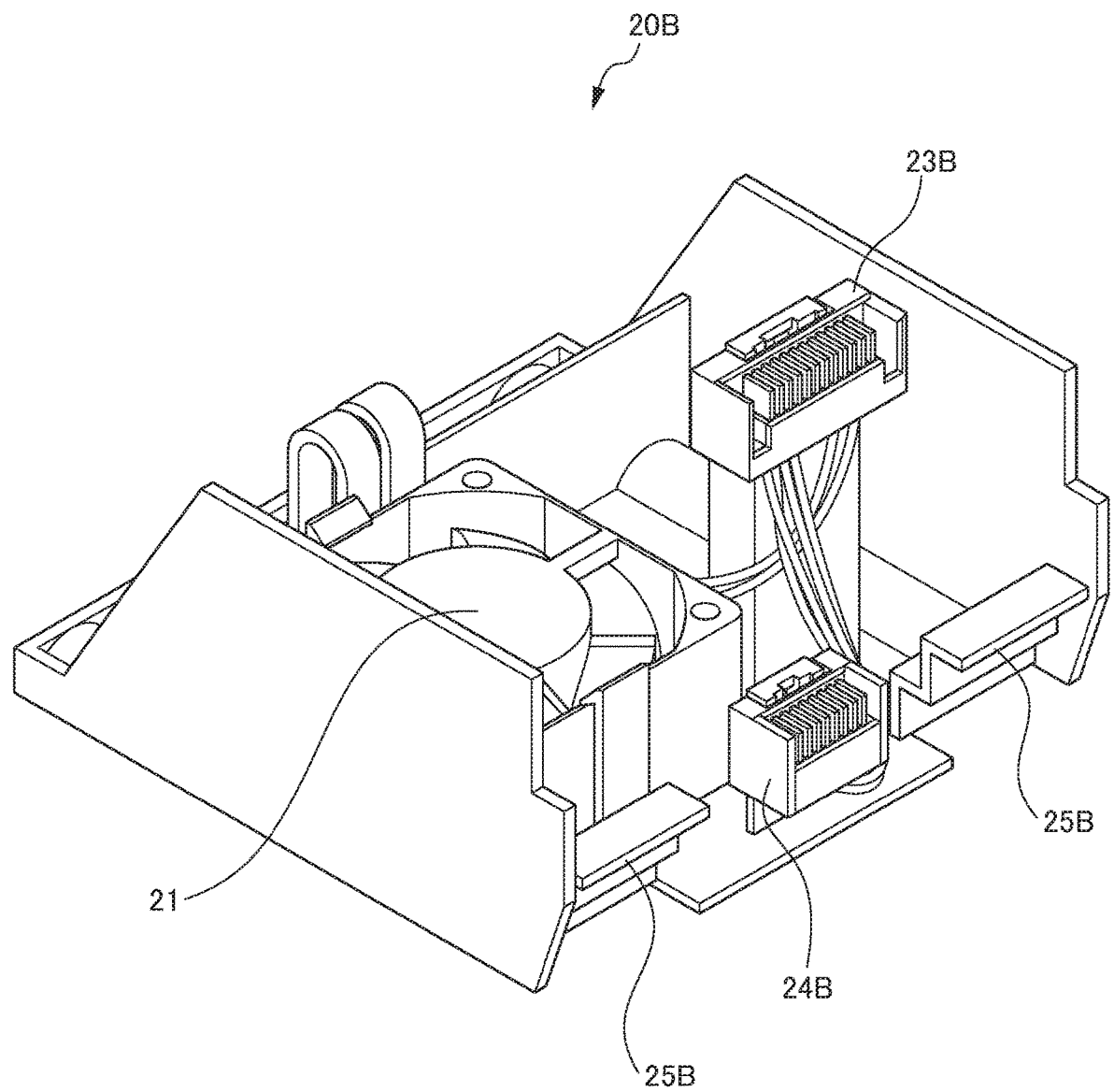
FIG. 26 is a diagram illustrating the configuration of a first fan unit in the third embodiment.
Figure 27:
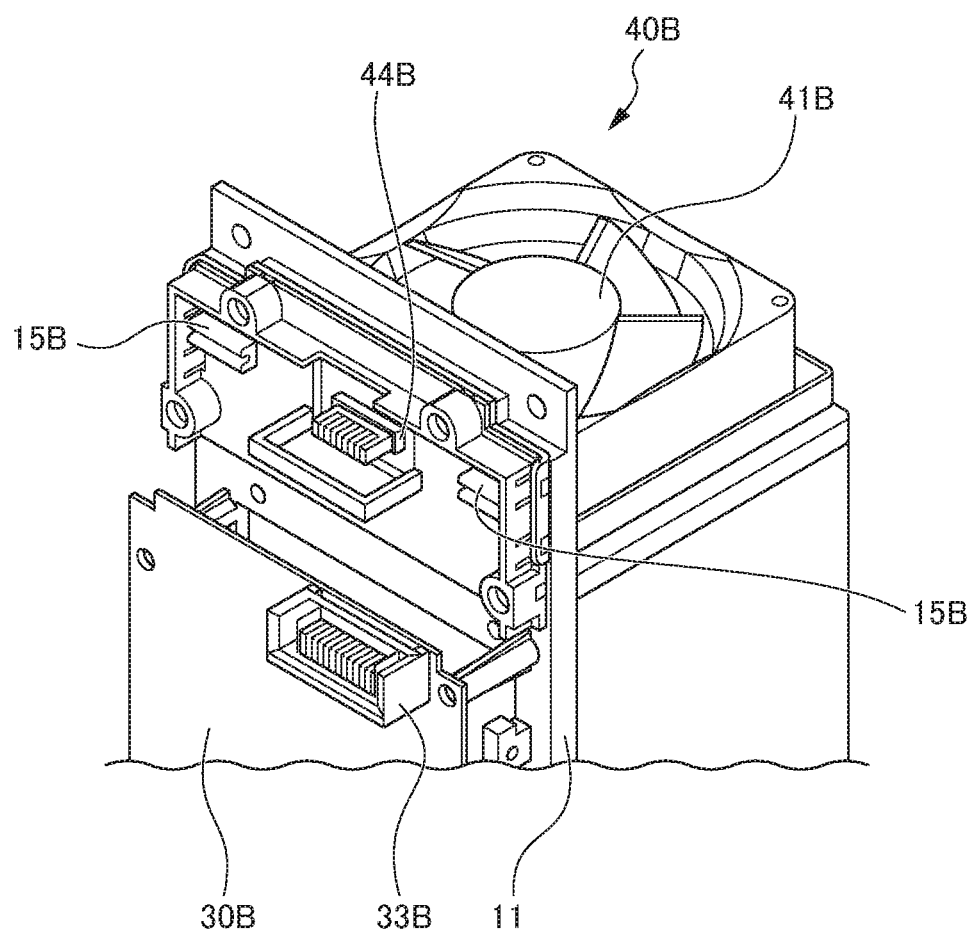
FIG. 27 is a diagram illustrating the arrangement of a second connector and a fourth connector in the third embodiment.
Figure 28:
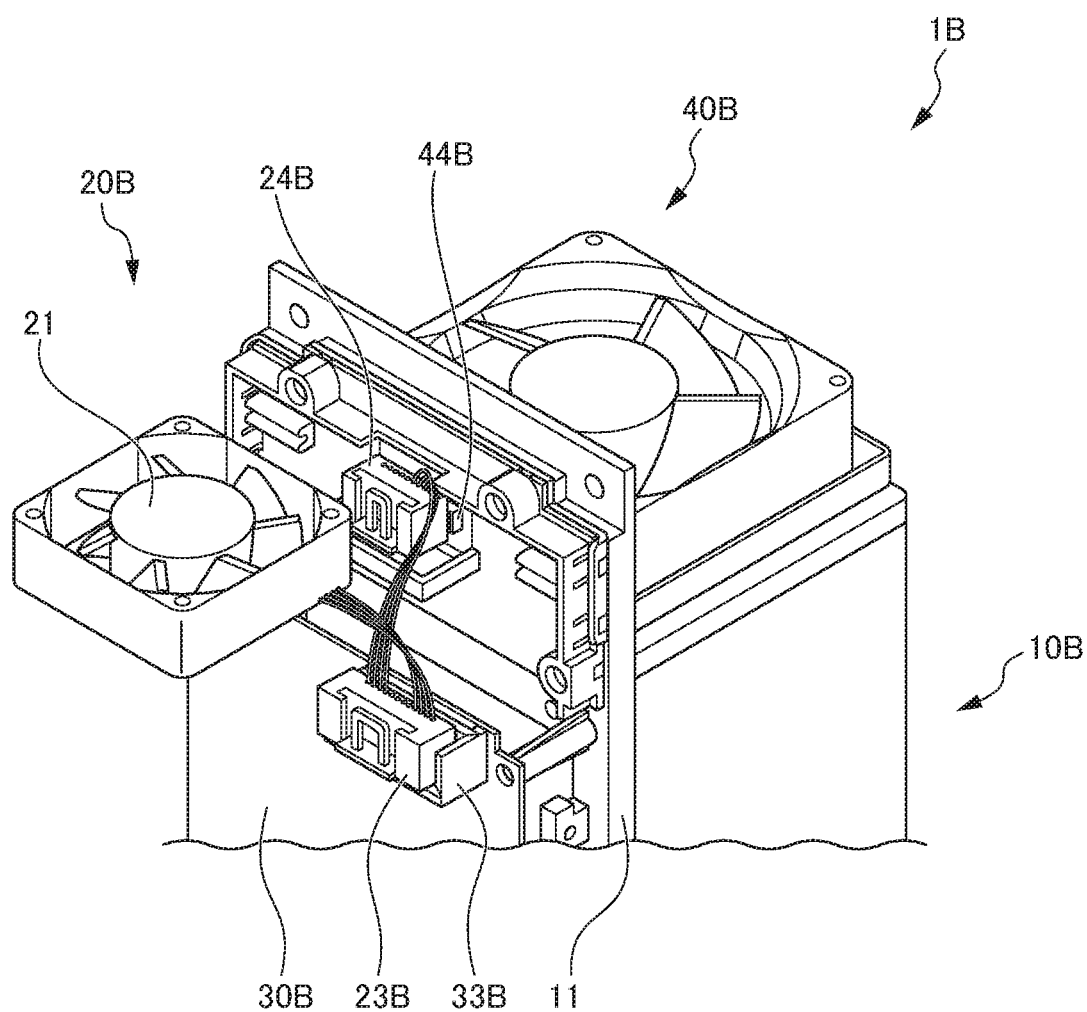
FIG. 28 is a diagram showing a state where a first connector and the second connector are fitted together and the second connector and the fourth connector are fitted together in the third embodiment.
Figure 29:
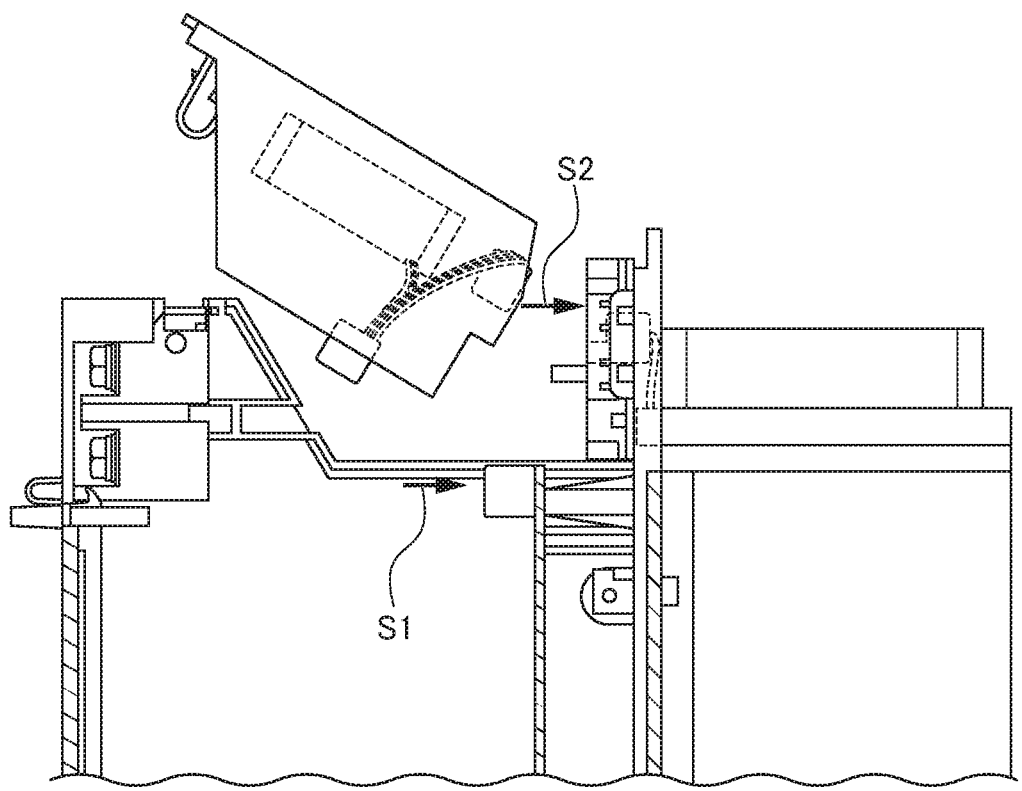
FIG. 29 is a diagram illustrating the direction of fitting of the first connector and the direction of fitting of a third connector in the third embodiment.

Next, the motor drive device 1B of the third embodiment will be described with reference to FIGS. 24 to 29. FIG. 24 is a perspective view of the motor drive device in the third embodiment. FIG. 25 is a cross-sectional view taken along line C-C in FIG. 24. FIG. 26 is a diagram illustrating the configuration of a first fan unit in the third embodiment. FIG. 27 is a diagram illustrating the arrangement of a second connector and a fourth connector in the third embodiment. FIG. 28 is a diagram showing a state where the first connector and the second connector are fitted together and the second connector and the fourth connector are fitted together in the third embodiment. FIG. 29 is a diagram illustrating the direction of fitting of the first connector and the direction of fitting of the third connector in the second embodiment. In the following discussion, configurations which differ from the first embodiment or the second embodiment will be described, and the description of the same configurations as in the first embodiment or the second embodiment will be omitted.

As shown in FIGS. 24 to 28, the motor drive device 1B of the present embodiment is a motor drive device which includes two fan units. The motor drive device 1B of the present embodiment includes a housing 10B (first housing 10a) which is formed substantially in the shape of a rectangular parallelepiped whose length in the width direction Y is long (for example, long as compared with the motor drive device of the second embodiment).

As shown in FIGS. 24 to 28, in the motor drive device 1B of the present embodiment, a printed circuit board 30B is arranged along the width direction Y (with a surface thereof directed perpendicular to the forward/backward direction X). As described above, the first housing 10a of the motor drive device 1B in the present embodiment is wide, and thus the printed circuit board 30B can be arranged along the width direction. Hence, the second connector 33B mounted on the printed circuit board 30B is arranged such that its contact is directed to the same side as the fourth connector 44B.

Hence, the third connector 24B arranged in the first fan unit 20B is also arranged such that its contact is directed to the same side as the first connector 23B. Specifically, in a state where the first fan unit 20B is fitted to the first housing 10a, the first connector 23B and the third connector 24B are arranged such that their contacts are directed to the same side (the X2 side in the forward/backward direction X).

In the motor drive device 1B, the printed circuit board 30B is arranged along the width direction Y (with the surface thereof directed perpendicular to the forward/backward direction X), and thus the second connector 33B and the fourth connector 44B mounted on the printed circuit board 30B are arranged such that their contacts are directed to the same side (the X1 side in the forward/backward direction X). In a state where the first fan unit 20B is fitted to the first housing 10a, the first connector 23B and the third connector 24B are arranged such that their contacts are directed to the same side (the X2 side in the forward/backward direction X).

Here, as in the embodiments described previously, the operator moves the first fan unit 20B obliquely downward from the upper side of the first housing 10a and also moves and turns the first fan unit 20B. The first fan unit 20B is moved from the non-fitting position in which the first connector 23B is not fitted to the second connector 33B and in which the third connector 24B is not fitted to the fourth connector 44B to the fitting position PK in which the first connector 23B is fitted to the second connector 33B and in which the third connector 24B is fitted to the fourth connector 44B. In this way, the first fan unit 20B is fitted to the first housing 10a (housing 10).

Here, as shown in FIG. 29, in the present embodiment, a configuration is adopted in which the first fitting direction S1 that is the direction of movement of the first connector 23 when the first connector 23 is fitted to the second connector 33 and the second fitting direction S2 that is the direction of movement of the third connector 24 when the third connector 24 is fitted to the fourth connector 44 are substantially the same as each other. Hence, when the first fan unit 20A is fitted, the individual connectors can be smoothly fitted. In this way, in the motor drive device 1B of the present embodiment, the first fan unit 20B can be smoothly attached to the first housing 10a, so as to have excellent maintainability.

In the present embodiment, in addition to the effects of the embodiments described above, the following effects are achieved. In the present embodiment, in the motor drive device 1B, the printed circuit board 30B is arranged along the width direction Y (with the surface thereof directed perpendicular to the forward/backward direction K), and thus the second connector 33B and the fourth connector 14B mounted on the printed circuit board 30B are arranged such that their contacts are directed to the same side (the X1 side in the forward/backward direction X). In a state where the first fan unit 20B is fitted to the first housing 10a, the first connector 23B and the third connector 24B are arranged such that their contacts are directed to the same side (the X2 side in the forward/backward direction X).

In this way, in the present embodiment, a configuration is adopted in which the first fitting direction S1 that is the direction of movement of the first connector 23 when the first connector 23 is fitted to the second connector 33 and the second fitting direction S2 that is the direction of movement of the third connector 24 when the third connector 24 is fitted to the fourth connector 44 are substantially the same as each other. In this way, when the first fan unit 20A is fitted, the individual connectors can be smoothly fitted. In this way, in the motor drive device 1B of the present embodiment, the first fan unit 20B can be smoothly attached to the first housing 10a, so as to have excellent maintainability.

Although the first to third embodiments are described above, the present invention is not limited to these embodiments. Variations and modifications which can achieve the object of the present invention are naturally included in the present invention. For example, although in the second and third embodiments, the first fan unit includes the first fan motor, there no limitation to this configuration, and a form in which the first fan unit does not include the first fan motor is also included in the present invention. In this case, the first fan unit is removably arranged in the upper surface or the lower surface of the housing (in the vertical direction) and includes the first connector, the third connector which is electrically connected to the first connector and the first turning engagement units which engage with the housing.

Although in the embodiments described above, the first turning engagement units are formed in a protruded shape, and the second turning engagement units are formed a concave shape, there is no limitation to this configuration, and the first turning engagement units may be formed in a concave shape, and the second turning engagement units may be formed in a convex shape. Furthermore, one of the first turning engagement unit and the second turning engagement unit may be an axis member, the other may be a member which engages with the axis member and the shape and the like are not particularly limited. Furthermore, the first turning engagement unit and the second turning engagement unit may engage with each other by magnetic force.

Figure 30A:
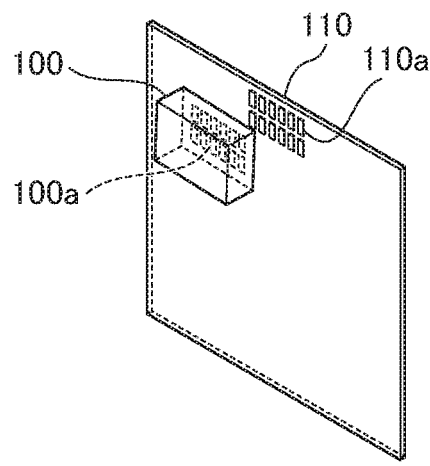
FIG. 30A is a diagram showing a variation of the connector, and is a diagram showing a first variation.
Figure 30B:
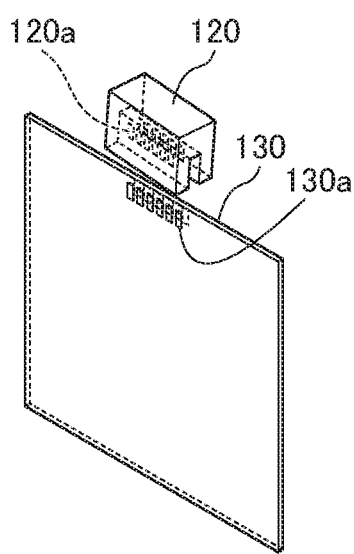
FIG. 30B is a diagram showing a variation of the connector, and is a diagram showing a second variation.

Although in the embodiments described above, each of the connectors has a structure which includes a plate-shaped contact, there is no limitation to this configuration, and for example, as shown in FIGS. 30A and 30B, each of the connectors may have a structure which includes a pad-shaped contact. As shown in FIG. 30A, connectors 100 and 110 respectively include a plurality of pads 100a and 110a (for example, solder pads). The connector 100 includes a plurality of pads 100a which are arranged on one side surface of a rectangular parallelepiped. The connector 110 includes a plurality of pads 110a which are directly arranged on one surface of the printed circuit board.

As shown in FIG. 30B, a connector 120 includes a concave portion, and also includes a plurality of pads 120a on the inner surface of the concave portion. A connector 130 includes a plurality of pads 130a which are directly arranged in a region near an outer edge of one surface of the printed circuit board. The connector 120 is moved such that the printed circuit board is inserted into the concave portion of the connector 120, and thus the pads 120a and 130a are brought into contact with (fitted to) each other.

Preferably, when as described above, the individual connectors include the pads as the contacts, the connectors can suitably cope with the contact (which corresponds to the fitting described above) resulting from various types of movements such as a slide movement and an opposite movement.

One of the connectors which are brought into contact with (fitted to) each other may include a spring member as the contact. This case is one of preferred forms because the contact (fitting) of the contacts is suitably maintained.

EXPLANATION OF REFERENCE NUMERALS 1 motor drive device
10 housing
10a first housing
10b second housing
11 inclined surface portion
15 second turning engagement unit
20 first fan unit
21 first fan motor
23 first connector
24 third connector
25 first turning engagement unit
26 fitting portion
28 first fan cover
30 printed circuit board
33 second connector
40 second fan unit
41 second fan motor
44 fourth connector
45a, 45b, 45c fixing portion
48 second fan cover
231 connector holding unit.
K turning axis
H storage region

What is claimed is:

1. A motor drive device comprising:
a housing;
a first fan unit which is removably arranged in an upper surface or a lower surface of the housing and which includes a first fan motor, a first connector that is electrically connected to the first fan motor, and a first turning engagement unit that engages with the housing; and
a printed circuit board which is arranged so as to be stored in the housing and which includes a second connector that is fitted to the first connector in a state where the first fan unit is fitted,
wherein the housing includes a recessed second turning engagement unit which engages with the first turning engagement unit, and an engagement end of the first turning engagement unit protrudes in a horizontal direction substantially perpendicular to a predetermined turning axis about which the first fan unit can be moved to be turned while the first turning engagement unit is engaged with the second turning engagement unit.

2. The motor drive device according to claim 1, wherein at least one of the first connector and the second connector includes a plate-shaped contact.

3. The motor drive device according to claim 1, wherein at least one of the first connector and the second connector includes a pad-shaped contact.

4. The motor drive device according to claim 1, wherein the first fan unit includes a first fan cover, and
the first fan cover includes a fitting portion which is fitted to the housing.

5. The motor drive device according to claim 1, wherein the first fan unit is removable with respect to the housing from obliquely forward of the housing.

6. The motor drive device according to claim 1, wherein a first fitting surface which is a contact root surface of the first connector fitted to the second connector is located on a plane that is substantially a same as a turning plane including a turning axis.

7. The motor drive device according to claim 1, wherein at least one of the first connector and the second connector includes a connector holding unit which movably holds the connector so as to absorb a backlash.

8. The motor drive device according to claim 1, wherein the second turning engagement unit pivotally supports a turning movement of the first fan unit.

9. A motor drive device comprising:
a housing;
a first fan unit which is removably arranged in an upper surface or a lower surface of the housing and which includes a first fan motor, a first connector that is electrically connected to the first fan motor, and a first turning engagement unit that engages with the housing; and
a printed circuit board which is arranged so as to be stored in the housing and which includes a second connector that is fitted to the first connector in a state where the first fan unit is fitted,
wherein the housing includes a second turning engagement unit which engages with the first turning engagement unit,
the second turning engagement unit is engaged with the first turning engagement unit and is disengaged therefrom by movement of the first fan unit in a direction intersecting a horizontal direction, in an engaged state where the second turning engagement unit is engaged with the first turning engagement unit, the second turning engagement unit pivotally supports a turning movement of the first fan unit, and
in the engaged state, the first fan unit is engaged with the housing such that the first fan unit can be moved to be turned about a predetermined turning axis both to a non-fitting position in which the first connector is not fitted to the second connector and to a fitting position in which the first connector is fitted to the second connector.

10. A motor drive device comprising:
a housing;
a first fan unit which is removably arranged in an upper surface or a lower surface of the housing and which includes a first fan motor, a first connector that is electrically connected to the first fan motor and a first turning engagement unit protruding from the first fan unit that engages with the housing; and
a printed circuit board which is arranged so as to be stored in the housing and which includes a second connector that is fitted to the first connector in a state where the first fan unit is fitted, wherein
the housing includes a second turning engagement unit which engages with the first turning engagement unit to pivotally support a turning movement of the first fan unit, and the pivotally supported turning movement of the first fan unit changes a direction of protrusion of the first turning engagement unit with respect to the housing.

* * * * *